US009379271B2

(12) United States Patent
Shen et al.

(10) Patent No.: US 9,379,271 B2
(45) Date of Patent: Jun. 28, 2016

(54) VARIABLE RANGE PHOTODETECTOR AND METHOD THEREOF

(71) Applicant: U.S. Army Research Laboratory, Washington, DC (US)

(72) Inventors: Paul Shen, North Potomac, MD (US); Lee Ellen Rodak, Montgomery Village, MD (US); Chad Stephen Gallinat, Washington, DC (US); Anand Venktesh Sampath, Montgomery Village, MD (US); Michael Wraback, Germantown, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 59 days.

(21) Appl. No.: 14/285,964

(22) Filed: May 23, 2014

(65) Prior Publication Data

US 2015/0311375 A1    Oct. 29, 2015

Related U.S. Application Data

(60) Provisional application No. 61/827,079, filed on May 24, 2013.

(51) Int. Cl.
*H01L 31/107* (2006.01)
*H01L 31/0224* (2006.01)
(Continued)

(52) U.S. Cl.
CPC ........ *H01L 31/1075* (2013.01); *H01L 31/0296* (2013.01); *H01L 31/022408* (2013.01);
(Continued)

(58) Field of Classification Search
CPC .............. H01L 31/107; H01L 31/1075; H01L 31/035272; H01L 31/03529; H01L 31/022408; H01L 31/0304; H01L 31/03044; H01L 31/03046; H01L 31/03048
See application file for complete search history.

(56) References Cited

U.S. PATENT DOCUMENTS 4,935,795 A    6/1990  Mikawa
6,326,654 B1  12/2001  Ruden
(Continued)

FOREIGN PATENT DOCUMENTS

EP    0150564 A3    5/1986
EP    0082787 B1    6/1987
EP    2175497 A2    4/2010

OTHER PUBLICATIONS

Yu et al. "Spontaneous and piezoelectric polarization effects in III-V nitride heterostructures", Jul./Aug. 1999, Journal of Vacuum Science & Technology B 17, No. 4, pp. 1742-1749.*
(Continued)

*Primary Examiner* — Khiem D Nguyen
*Assistant Examiner* — Pauline Vu
(74) *Attorney, Agent, or Firm* — Lawrence E. Anderson

(57) ABSTRACT

A method of making and a photodetector comprising a substrate; a p-type or n-type layer; first and second region each having polarizations, a first interface therebetween, the magnitudes and directions of the first and second polarizations being such that a scalar projection of second polarization on the growth direction relative to the scalar projection of the first polarization projected onto the growth direction is sufficient to create a first interface charge; and a third region suitable for forming one of an n-metal or p-metal contact thereon having a third polarization, a second interface between the second and third regions, the third polarization having a scalar projection on the growth direction that, relative to scalar projection of the second polarization onto the growth direction, is sufficient to create a second interface charge; the first and second interface charges creating an electrostatic potential barrier to carriers defining a predetermined wavelength range.

19 Claims, 12 Drawing Sheets

(51) Int. Cl.
  *H01L 31/0296* (2006.01)
  *H01L 31/0304* (2006.01)
  *H01L 31/0336* (2006.01)
  *H01L 31/0352* (2006.01)
  *H01L 31/18* (2006.01)

(52) U.S. Cl.
  CPC ...... *H01L31/0336* (2013.01); *H01L 31/03044* (2013.01); *H01L 31/03529* (2013.01); *H01L 31/18* (2013.01); *Y02P 70/521* (2015.11)

(56) References Cited

U.S. PATENT DOCUMENTS

| | | | |
|---|---|---|---|
| 6,838,741 B2 | 1/2005 | Sandvik | |
| 7,049,640 B2 | 5/2006 | Boisvert | |
| 7,902,545 B2* | 3/2011 | Csutak | B82Y 20/00 257/14 |
| 8,269,222 B2 | 9/2012 | Shen et al. | |
| 8,269,223 B2 | 9/2012 | Wraback | |
| 2004/0108530 A1 | 6/2004 | Arthur et al. | |
| 2004/0251483 A1* | 12/2004 | Ko | H01L 31/107 257/292 |
| 2005/0098884 A1 | 5/2005 | Cheng | |
| 2005/0218414 A1* | 10/2005 | Ueda | H01L 21/02082 257/94 |
| 2006/0186501 A1* | 8/2006 | Ishimura | H01L 31/107 257/436 |
| 2006/0263923 A1* | 11/2006 | Alfano | B82Y 10/00 438/48 |
| 2007/0093073 A1* | 4/2007 | Farrell, Jr. | B82Y 20/00 438/763 |
| 2007/0194300 A1* | 8/2007 | Ibbetson | H01L 29/88 257/30 |
| 2008/0283822 A1* | 11/2008 | Yui | H01L 33/06 257/13 |
| 2009/0065900 A1* | 3/2009 | Saito | H01L 33/16 257/615 |
| 2009/0325339 A1* | 12/2009 | Niiyama | B82Y 20/00 438/72 |
| 2010/0006780 A1* | 1/2010 | Metcalfe | G02F 2/004 250/504 R |
| 2010/0187550 A1* | 7/2010 | Reed | H01L 33/18 257/98 |
| 2010/0220761 A1* | 9/2010 | Enya | H01S 5/3202 372/45.01 |
| 2011/0291108 A1* | 12/2011 | Shen | H01L 31/03687 257/77 |
| 2011/0291109 A1* | 12/2011 | Wraback | H01L 31/107 257/77 |
| 2013/0032860 A1* | 2/2013 | Marino | H01L 29/66462 257/194 |
| 2014/0084146 A1 | 3/2014 | Boisvert | |

OTHER PUBLICATIONS

Romanov, A. E. et al. "Strain-induced polarization in wurtzite III-nitride semipolar layers", Jul. 2006, Journal of Applied Physics 100, No. 2, 10 pages.*

Guo, Xiangyi et al. "Performance of low-dark-current 4H-SiC avalanche photodiodes with thin multiplication layer", Sep. 2006, Electron Devices, IEEE Transactions on 53, No. 9, pp. 2259-2265.*

Bai, Xiaogang et al. "High detection sensitivity of ultraviolet 4H-SiC avalanche photodiodes", Dec. 2007, Quantum Electronics, IEEE Journal of 43, No. 12, pp. 1159-1162.*

Ozbay, Ekmel, "High Performance Solar Blind Photodetectors Based on $AL_xGa_{1-x}N$ Heterostructures," IEEE Journal of Selected Topics in Quantum Electronics, vol. 10, No. 4, Jul./Aug. 2004, p. 742.

O. Ambacher, "Growth and Applications of Group III Nitrides, "J. Phys. D: Appl. Phys. 31 (1998) 2653-2710.

Sun. Lu, et al., "AlGaN solar-blind avalanche photodiodes with high multiplication gain,"Appl. Phys. Lett. 97, 191103 (2010); http://dx.doi.org/10.1063/1.3515903.

Lambert, D., et al. "Back illuminated AlGaN Solar-blind Photodetectors,"Appl. Phys. Lett. 77, 1900 (2000); http://dx.doi.org/10.1063/1.1311821.

Bai, X, et al. "High-performance SiC avalanche photodiode for single ultraviolet photon detection," Digest of the IEEE/LEOS Summer Topical Meetings, 2007 pp. 141-142; Digital Object Identifier: 10.1109/LEOSST.2007.4288372.

U. Schühle and J.-F. Hochedez, "Solar-blind UV detectors based on wideband gap semiconductors," Observing Photons in Space, A Guide to Experimental Space Astronomy, Martin C.E. Huber, et al., editors, Second Edition, Chapter 26 (2013).

* cited by examiner

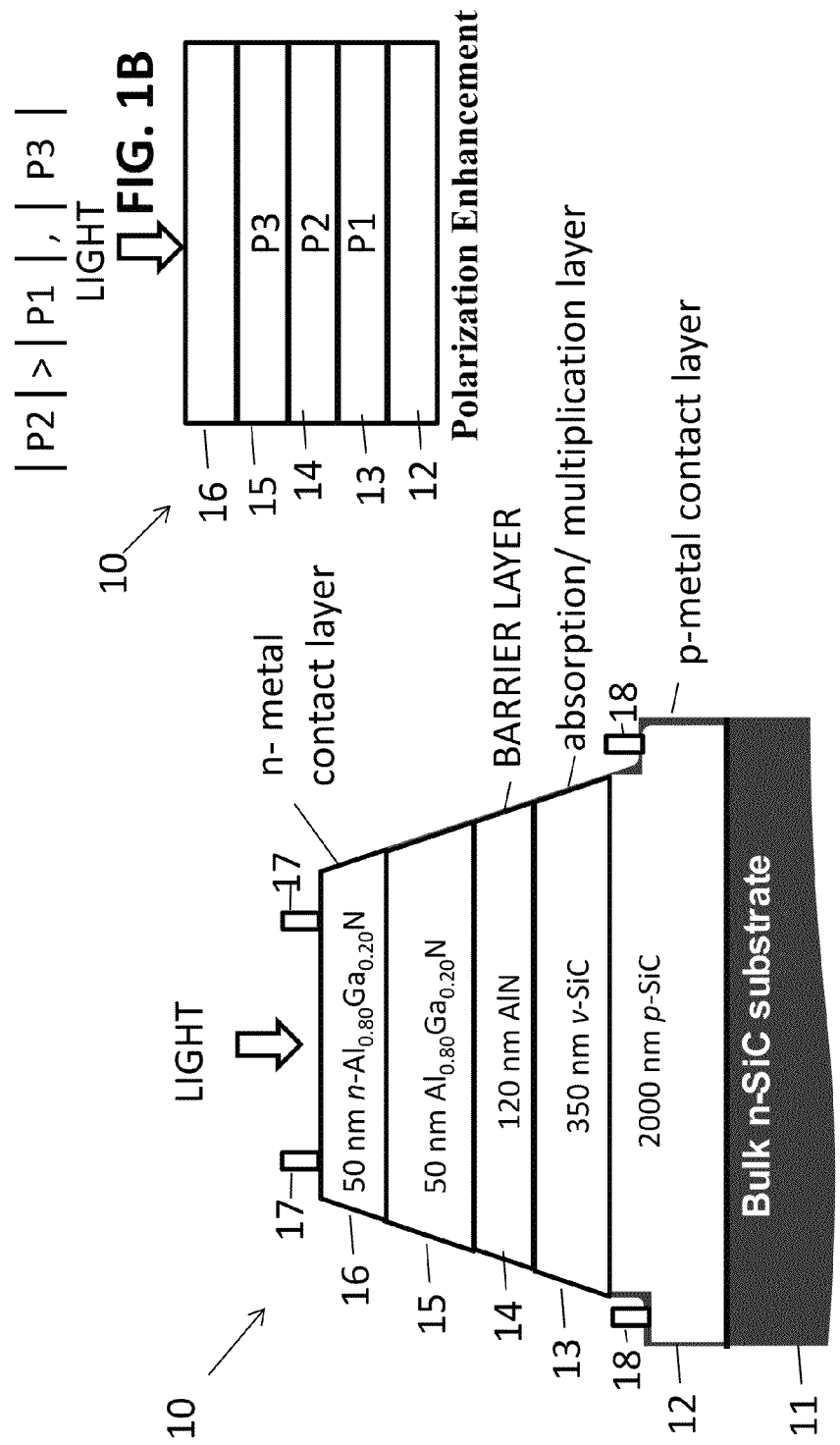

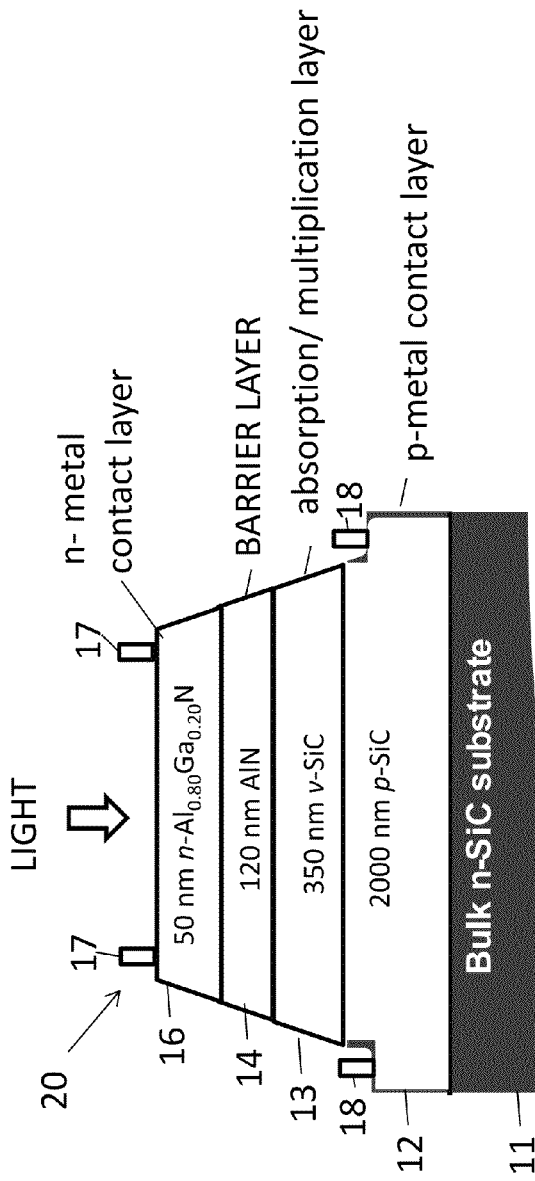
FIG. 2A
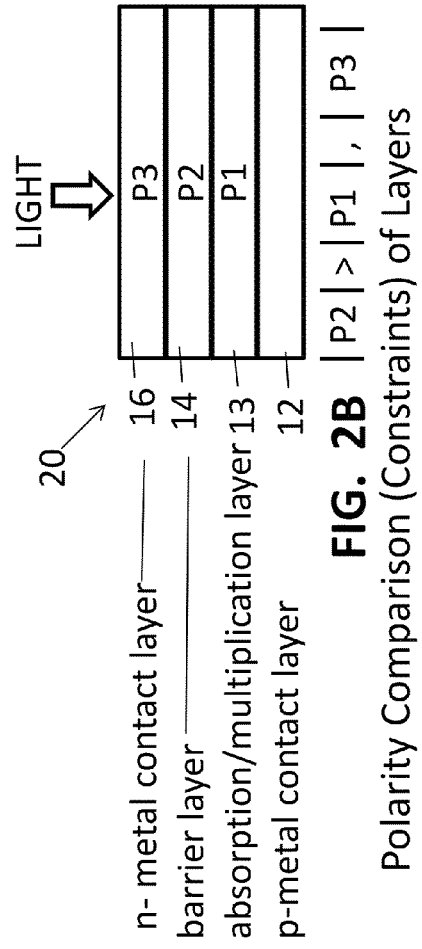
FIG. 2B  $|P2| > |P1|, |P3|$
Polarity Comparison (Constraints) of Layers Wurtzite structure for III-V and II-VI polar semiconductors

FIG. 8B  GROUP II or Group III-Polar Materials
FIG. 8C  GROUP V or Group VI-Polar Materials

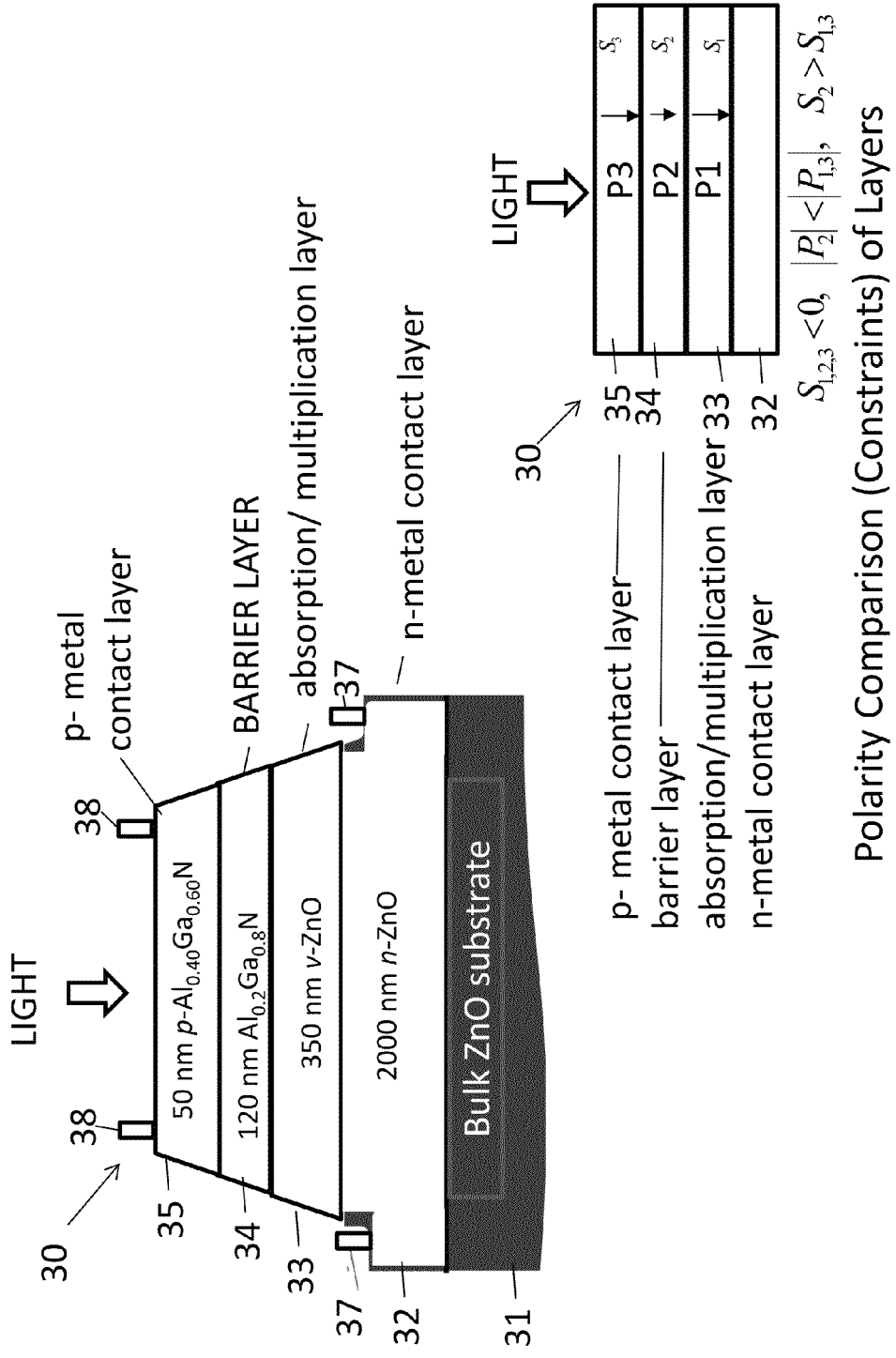
FIG. 9A Group II or Group III-polar, n-Down device

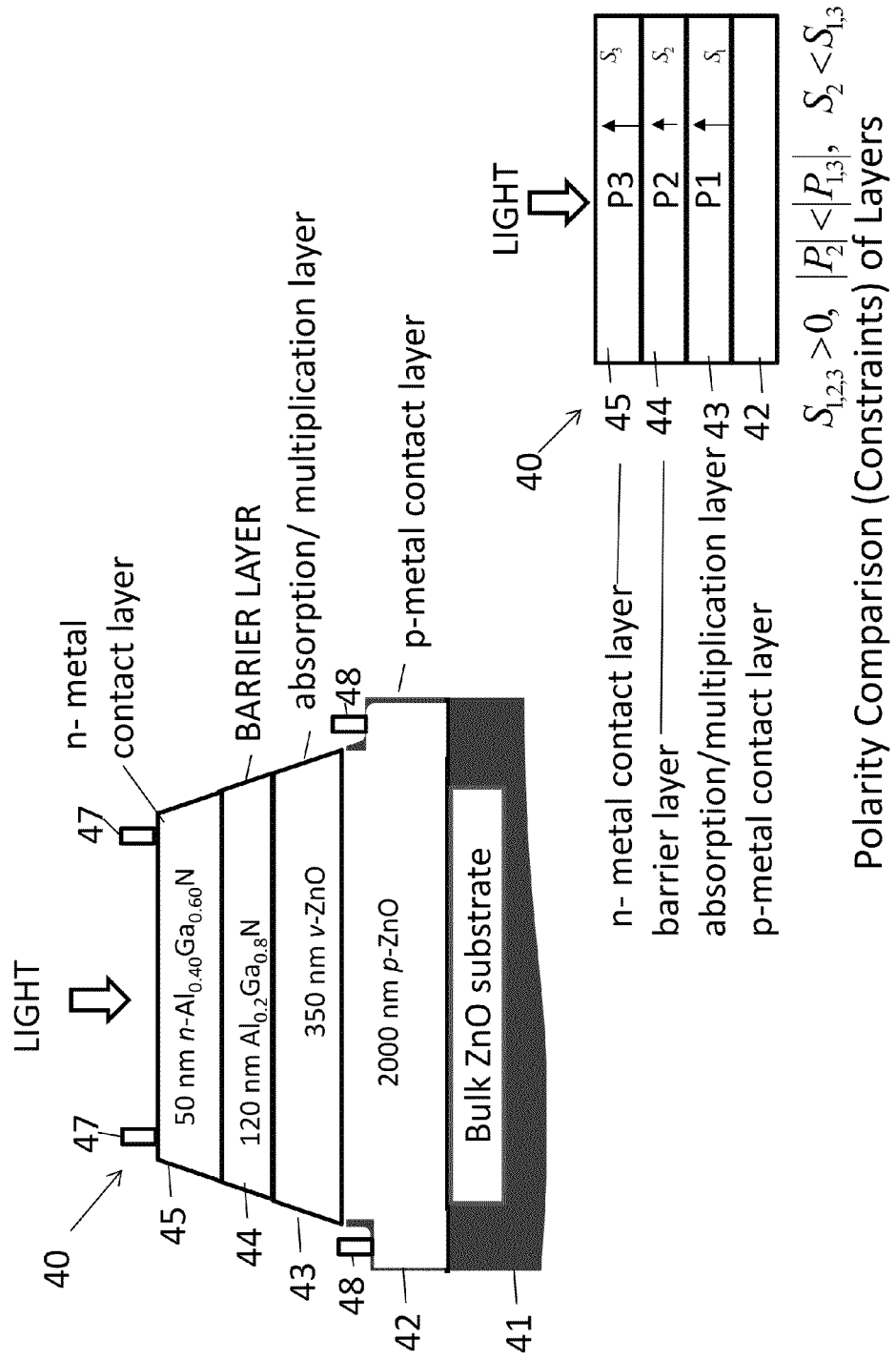
FIG. 9B Group V or Group VI-polar, *p*-Down device

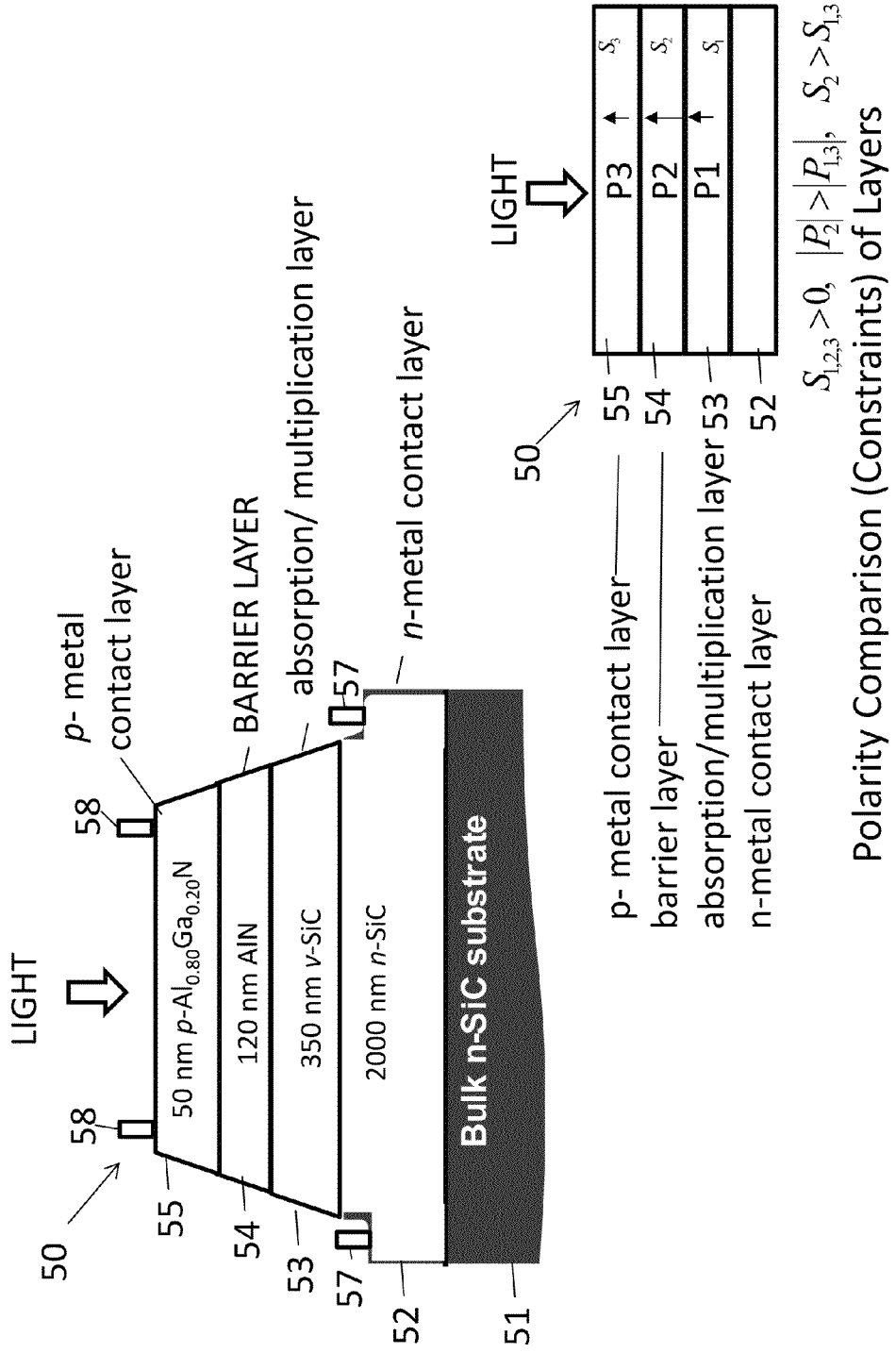
FIG. 9C Group V or Group VI-polar, n-Down device

VARIABLE RANGE PHOTODETECTOR AND METHOD THEREOF

CROSS-REFERENCE TO RELATED APPLICATIONS

This application claims priority of U.S. Provisional Patent Application Ser. No. 61/827,079 entitled "Photodetector With Polarization Induced Electron Filter And Method Thereof," filed May 24, 2013, which is incorporated herein by reference.

GOVERNMENT INTEREST

The embodiments herein may be manufactured, used, and/or licensed by or for the United States Government without the payment of royalties thereon.

BACKGROUND OF THE INVENTION

In avalanche photodiodes or photodetectors, incoming light is used to generate carriers (i.e., free electrons or holes). Semiconductor materials are selected for photodiodes based upon the wavelength range of the radiation that is desired to be utilized or detected. Group III-nitride avalanche detectors can presumably be widely functional between 1900 nm and 200 nm (i.e. infrared to ultraviolet radiation). Generally, the binary alloys utilized in such semiconductor devices are Indium Nitride (bandgap of 0.65 eV corresponding to approximately 1900 nm), Gallium Nitride (band gap of 3.4 eV corresponding to approximately 365 nm) and Aluminum Nitride (bandgap of 6.1 eV corresponding to approximately 200 nm). By varying the relative mole fractions of these binaries, ternary or quaternary alloys may be composed that can achieve radiation absorption at intermediate wavelengths to the stated values.

III-Nitride semiconductors are commonly grown in the wurtzite crystal structure and are therefore a polar semiconductor as discussed by Ambacher in O. Ambacher, "Growth and Applications of Group III Nitrides, "J. Phys. D: Appl. Phys. 31 (1998) 2653-2710, herein incorporated by reference as though fully rewritten herein.

U.S. Pat. No. 6,326,654 to Ruden (hereinafter Ruden '654; hereby incorporated by reference) entitled "A Hybrid Ultraviolet Detector," discloses a semiconductor material avalanche photodiode photodetector. The detector of Ruden '654 is an avalanche photodetector comprised of a group III-nitride semiconductor material, such as aluminum gallium nitride ($Al_xGa_{1-x}N$), serving as a photon to charge carrier transducer, and an avalanche charge carrier multiplication region comprised of different semiconductor materials such as silicon (see abstract).

Deep ultraviolet (DUV) photodetectors sensitive at wavelengths shorter than 260 nm are useful in numerous medical and military applications, including chemical and biological identification and non-line of sight communications. Often, these applications require very low light level or single photon detection and, as a result, photomultiplier tubes (PMTs) are widely used. However, in addition to being large and fragile, photomultiplier tubes require the use of expensive filters to limit the bandwidth of detection. Therefore, a need remains for low cost, compact, high sensitivity devices that offer a narrow and tunable bandwidth. Silicon Carbide (SiC) has emerged as an attractive candidate for DUV pin and avalanche photodetectors (APDs) due to their very low dark currents, small k factor, and high gain. Previously demonstrated APDs exhibit peak quantum efficiency (QE) of 60% at 268 nm and gain values reaching over 1000. Despite this success, SiC is still characterized by poor responsivity below 260 nm and a long absorption tail out to 380 nm. The deep ultraviolet response in pin detectors is hindered by the absorption of high energy photons in the heavily doped surface layer (p- or n-type) where photo-generated carriers are trapped by surface states or recombine due to the short diffusion length of minority carriers. The long wavelength tail results from weak absorption associated with the indirect bandgap of 4H-SiC at 3.23 eV.

SUMMARY

In accordance with the present invention, a preferred embodiment photodetector for detecting photons in a predetermined wavelength range comprises a substrate; a p-type layer located above the substrate; a first region in which the absorption and multiplication of carriers occurs, the first region having a crystalline structure having a growth direction and a first total polarization having a magnitude and direction; a second region adjacent to the first region having a second total polarization, the second region comprising a crystalline structure having a growth direction and a second total polarization having a magnitude and direction, the first and second regions forming a first interface therebetween, the magnitudes and directions of the first and second total polarizations being such that a scalar projection of second total polarization on the growth direction is less than a scalar projection of the first total polarization projected onto the growth direction thereby creating a positive first interface charge; and a third region suitable for forming an n-metal contact thereon, the third region having a crystalline structure having a growth direction and a third total polarization with a magnitude and direction, the second and third regions forming a second interface therebetween, the third total polarization having a scalar projection on the growth direction that is greater than the scalar projection of the second polarization onto the growth direction, creating a negative second interface charge; the first and second interface charges separated by the thickness of the second region creating an electrostatic potential barrier to carriers of differing energy levels; the electrostatic barrier defining a predetermined wavelength range of the photodetector.

In accordance with the present invention, an alternate preferred embodiment photodetector for detecting photons in a predetermined wavelength range comprises a substrate; a n-type layer located above the substrate; a first region in which the absorption and multiplication of carriers occurs, the first region having a crystalline structure having a growth direction and a first total polarization having a magnitude and direction; a second region adjacent to the first region, the second region having a crystalline structure having a growth direction and a second total polarization having a magnitude and direction, the first and second regions forming a first interface therebetween, the magnitudes and directions of the first and second total polarizations being such that a scalar projection of second total polarization on the growth direction is greater than a scalar projection of the first total polarization projected onto the growth direction thereby creating a negative first interface charge; and a third region suitable for forming a p-metal contact thereon, the third region having a crystalline structure having a growth direction and a third total polarization having a magnitude and direction, the second and third regions forming a second interface therebetween, the third total polarization having a scalar projection on the growth direction that is less than the scalar projection of the second polarization onto the growth direction, creating a positive second interface charge; the first and second interface charges separated by the thickness of the second region creating an electrostatic potential barrier to carriers of differing energy levels; the electrostatic barrier defining a predetermined wavelength range of the photodetector.

In accordance with the present invention, a preferred method of making a photodetector which detects light in a predetermined spectrum comprises;

providing a substrate;

forming a p-type contact region on the base;

forming a first region in which the absorption and multiplication of carriers occurs, the first region having a first total polarization;

forming a first interface by forming a second region adjacent to the first region, the second region having a magnitude of the second total polarization greater than the magnitude of the first total polarization of the first region;

forming a second interface by forming a third region comprising an n-metal contact region, the third region having a third total polarization having a magnitude that is less than the polarization of the second region, the polarizations of the first and second regions operating to create a first interface charge at the first interface and the polarizations of the second and third regions operating to form a second interface charge at the second interface; the first and second interface charges creating an electrostatic potential barrier to carriers of differing energy levels;

adjusting the electrostatic potential barrier by adjusting the one of the thickness of the second region, the voltage differential across the photodetector, or the material composition or doping of the first, second or third regions to define a predetermined wavelength range of the photodetector.

These and other embodiments will be described in further detail below with respect to the following figures.

BRIEF DESCRIPTION OF THE DRAWINGS

FIG. 1A is a schematic illustration of a preferred embodiment of the present invention.

FIG. 1B is a schematic illustration showing polarizations of layers 13, 14 and 15 of the preferred embodiment of FIG. 1A.

FIG. 2A is a schematic illustration of another preferred embodiment of the present invention.

FIG. 2B is a schematic illustration showing polarizations of layers 13, 14 and 16 of the preferred embodiment of FIG. 2A.

FIG. 3 illustrates the DC responsivity of SiC/AlN/$Al_xGa_{(1-x)}N$ nip photodiode at zero, 5, 10, 15, 20, 22, 24, 25, 30, 35 and 40 volts reverse bias.

FIG. 5 illustrates the modulated responsivity of SiC/AlN/$Al_xGa_{(1-x)}N$ nip photodiode at zero, 10, and 30 volts reverse bias.

FIG. 8B is a schematic generalized illustration of the portions of the embodiments of FIGS. 1A and 2A which have a determinative polarization component to enable the creation of the electrostatic potential barrier formed of Group III- or Group II-polar materials and/or SiC. The left side of FIG. 8B is directed preferred embodiments in which the P-type layer is grown closest to the substrate. The right side of FIG. 8B is directed preferred embodiments in which the N-type layer is grown closest to the substrate.

FIG. 8C is a schematic generalized illustration of the portions of the embodiments of FIGS. 1A and 2A which have a determinative polarization component to enable the creation of the electrostatic potential barrier formed of Group V- or Group VI-polar materials and/or SiC. The left side of FIG. 8C is directed preferred embodiments in which the P-type layer is grown closest to the substrate. The right side of FIG. 8C is directed preferred embodiments in which the N-type layer is grown closest to the substrate.

FIG. 9A is a schematic illustration of an alternate preferred embodiment of the present invention correlating to the generalized illustration of the right side of FIG. 8B.

FIG. 9B is a schematic illustration of an alternate preferred embodiment of the present invention correlating to the generalized illustration of the left side of FIG. 8C.

FIG. 9C is a schematic illustration of an alternate preferred embodiment of the present invention correlating to the generalized illustration of the right side of FIG. 8C.

Figure 3:
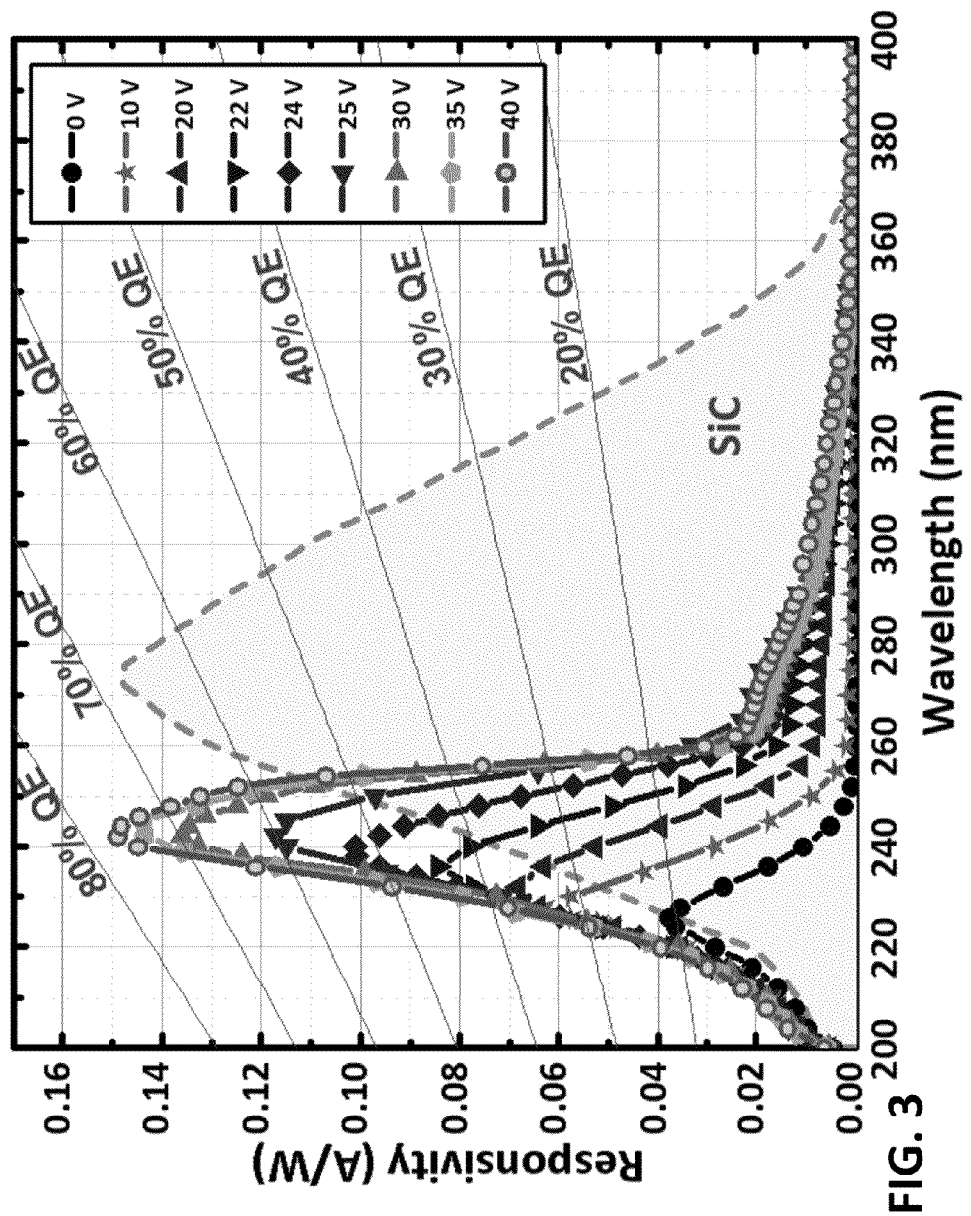
FIG. 3 is the measured DC spectral response of SiC/AlN/$Al_xGa_{(1-x)}N$ nip photodiode at varying reverse bias voltage (closed figures). The DC spectral response for a homogeneous SiC pin photodiode is shown for comparison (dashed line).

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DETAILED DESCRIPTION OF THE PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that, although the terms first, second, etc. may be used herein to describe various ranges, elements, components, regions, layers and/or sections, these elements, components, regions, layers and/or sections should not be limited by these terms. For example, when referring first and second ranges, these terms are only used to distinguish one range from another range. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention. Additionally, the drawings are not to scale. Relative sizes of components are for illustrative purposes only and do not reflect the actual sizes that may occur in any actual embodiment of the invention. Like numbers in two or more figures represent the same or similar elements. Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Embodiments of the present invention are described herein with reference to cross-section illustrations that are schematic illustrations of idealized embodiments of the present invention. As such, variations from the shapes of the elements in the illustrations are to be expected. Thus, embodiments of the present invention should not be construed as limited to the particular shapes of regions illustrated herein but are to include deviations in shapes. Thus, the layers or regions illustrated in the figures are schematic in nature and their shapes are not intended to illustrate the precise shape of a layer or region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The preferred embodiment 10 of FIG. 1A may be, for example, a III-Nitride/SiC nip structure comprising a p-type semiconductor metal contact region or layer 12, which may be, for example, a 2 µm thick p-SiC layer doped $2\times10^{19}$ cm$^{-3}$, an absorption/multiplication region or layer 13, which may be, for example, a 350 nm thick n$^-$-SiC layer lightly doped n-type $5\times10^{15}$ cm$^{-3}$, a transparent barrier region or layer 14, which may be, for example, a 120 nm thick AlN layer, a transparent window layer or region 15, which may be, for example, a 50 nm thick $Al_{0.80}Ga_{0.20}N$ layer 15, and a region 16 suitable for forming an n-metal contact, which may be, for example, a 50 nm thick n+-$Al_{0.80}Ga_{0.20}N$ layer. The thickness of barrier region or layer 14 may be as thin as 5 nm. The region or layer 15 is predominantly transparent to photons of interest for conversion in that these photons are generally not converted to electrons and holes in region or layer 15. The SiC epitaxial layers or regions may be grown on n-type Si-face 4H-SiC substrate 11. The III-polar $Al_xGa_{(1-x)}N$ epitaxial layers or regions may be heteroepitaxially grown by plasma assisted molecular beam epitaxy at 780° C. directly upon the SiC epitaxial layers or regions. The two $Al_xGa_{(1-x)}N$ layers or regions 15 and 16 may be combined into a single layer and may be fully strained to the AlN region 14, which is relaxed, as determined by high resolution x-ray diffraction. Epilayers were fabricated into 250 µm diameter, circular mesas with seven degree beveled sidewalls. The n-$Al_xGa_{(1-x)}N$ Ohmic contact 17 comprises of a stack comprising Ti 10 nm/Al 100 nm/Ni 30 nm/Au 50 nm metallization scheme while the p-SiC Ohmic contact 18 consists of Ni 25 nm/Ti 35 nm/Al 100 nm/Ni 80 nm. The contacts 17 and 18 are similar to element number 7 in the U.S. Pat. No. 8,269,223, FIG. 23, herein incorporated by reference. The selection of metals for the contact layer depend upon metal work-function, adhesion, as well as impurity diffusion considerations. There are a number of Ohmic contacts schemes to n-AlGaN and p-SiC reported in the literature. The stacks that may be used are commonly employed. The constraint is that the contacts make a low resistance Ohmic contact; in contrast to a Schottky contact.

The semiconductor absorption/multiplication region 13 (which may be designated as a first region), barrier region or layer 14 (which may be designated as a second region) and the third region 15 each have a total polarization P1, P2 and P3, respectively. In accordance with the principles of the present invention, the magnitude of the total polarization of the barrier region 14 having a polarization magnitude P2 (defined in terms of absolute value) that is greater than either of the magnitudes of the total polarizations of the absorption/multiplication region 13, which has a total polarization of P1, or the transparent region 15, which has a total polarization of P3. This results in interface charge densities due to the discontinuity in polarization at the heterointerfaces between regions 13, 14 and 15 that enable a large electrostatic potential barrier and therefore a large electric field across region 14 that suppresses the collection of photogenerated carriers excited to the lower energy band gaps of region 13. As a result, this structure eliminates or reduces the requirement for an optical filter for tuning the bandwidth of the photodetector near the lower energy band gaps of absorption/multiplication region.

It is important to note that the dipole strength and energy barrier presented for carrier transport by the barrier layer 14 is dependent on the net total charge at the heterointerfaces between the barrier layer 14 and the absorption multiplication layer 13 as well as interface between the barrier layer 14 and the n-metal contact layer 15 or 16, and the doping of these layers may be used to further modify the dipole strength and energy barrier. Specifically, the introduction of ionized acceptor impurities at the heterointerface between the barrier layer 14 and the absorption multiplication layer 13 or ionized donor impurities at the heterointerface between the barrier layer 14 and the n-metal contact layer 15 or 16 may be used to reduce the net total charge at either of these interfaces and therefore reduce the dipole strength and energy barrier. Conversely, the introduction of ionized donor impurities at the heterointerface between the barrier layer 14 and the absorption multiplication layer 13 or ionized acceptor impurities at the heterointerface between the barrier layer 14 and the n-metal contact layer 15 or 16 may be used to increase the net total charge at either of these interfaces and therefore increase the dipole strength and electrostatic potential barrier. By adjusting the charge, the height (in terms of energy needed to surmount it) of the electrostatic potential barrier may be adjusted.

By using a transparent layer or region 15 comprising $Al_xGa_{(1-x)}N$ in conjunction with the preferred embodiment 10 shown in FIG. 1A, the short wavelength cutoff of $Al_xGa_{(1-x)}N$ can be tuned from 365 to 200 nm.

An alternative preferred embodiment assembly 20 is illustrated in FIG. 2A. The preferred embodiment 20 comprises a p-metal contact layer or region 12 which may be positioned or formed on a substrate 11, such as a bulk SiC substrate. The absorption/multiplication region or layer 13 is formed on the p-metal contact layer 12 as shown in FIG. 2A. Barrier layer or region 14 is formed on region 13 and N-metal contact layer or region 16 is formed on the barrier region 14. As illustrated in FIG. 2B, the magnitude of the total polarization P2 of the barrier region 14 (which may be denoted as the second region) is greater than the magnitude of the polarization of either of the regions 13 (P1) (which may be denoted as the first region) or 16 (P3) (which may be denoted as the third region). The interface charge densities that arise due to the discontinuity in polarization at the interfaces between regions 13 and 16 with respect to barrier region 14 enable a large electrostatic potential barrier and therefore a large electric field across barrier region 14 that suppresses the collection of photogenerated carriers excited to the lower energy band gaps of absorption/multiplication region 13, as depicted in general by the band diagram shown in FIG. 4.

Material selection for the regions 13, 14 and 16 may include any semiconductor materials for which the conditions |P2|>|P3| and |P1| are satisfied. That is, the magnitude of the polarization of the barrier region 14 is greater than the magnitude of the polarization of the n-metal contact layer 16 and the absorption/multiplication region 13. For example, the regions could be alloys of $Al_xGa_{1-x}N$ where different amounts of aluminum are used to regulate the magnitude of polarization. Other examples are magnesium zinc oxide, aluminum gallium arsenide, indium gallium arsenide, and indium gallium nitride. A further example is where the P1 material is chosen as silicon and the P2 and P3 regions aluminum gallium nitride. The electrostatic potential energy barrier in barrier region 14 is significantly enhanced by the dipole formed by the fixed interface polarization charge induced by the difference in polarization between the barrier region and the absorption/multiplication and n-contact regions. As is known, without a barrier, holes migrate to the p contact and electrons migrate to the n contact. The barrier region 14, in FIGS. 1A, 1B, 2A and 2B prevents hole transport and collection from the $Al_xGa_{1-x}N$ layer (15 in FIG. 1, 16 in FIG. 2). High energy photogenerated electrons in the SiC absorption/multiplication region (13) can traverse the barrier region and be collected in the n-metal contact region 16 in FIG. 1 or 2. Lower energy photogenerated electrons in SiC absorption/multiplication region 13 cannot traverse the barrier layer, so those carriers are not collected. As a result, long wavelength photoresponse is suppressed without using an optical filter.

Figure 4:
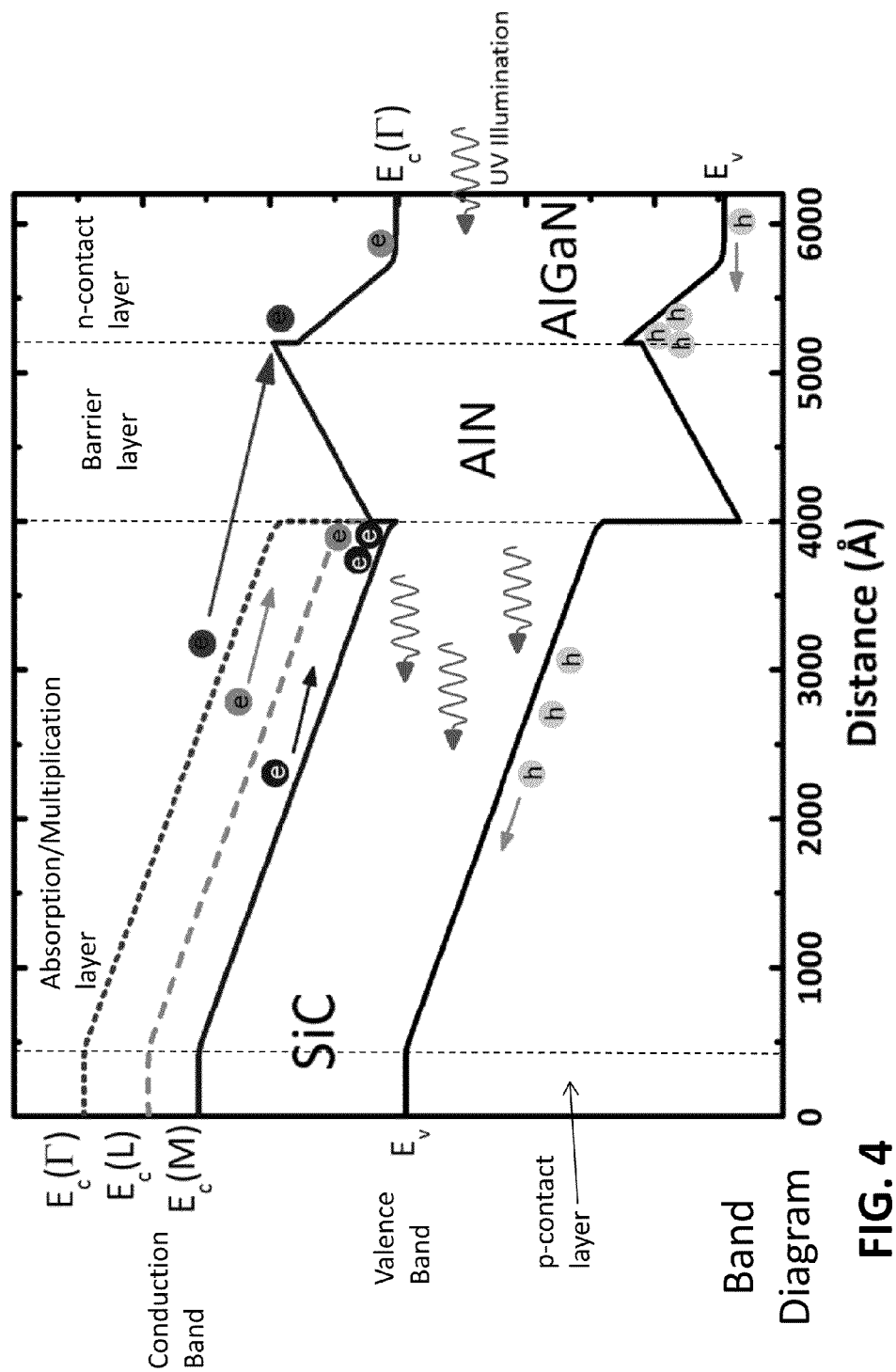
FIG. 4 is a band diagram illustrating the principles of a preferred embodiment of the present invention.

The employment of polarization induced charge densities arising from the difference in polarization between the barrier layer 14 and the surrounding regions results in significant suppression of long wavelength response in the device without requiring an optical filter. As shown in the band diagram of FIG. 4, the barrier region of a Group-III Nitride material, which in this case is AlN, creates a barrier for the transport of electrons excited to the L and M conduction bands of the absorption multiplication region 13, which in this case is SiC, (shown to the left of FIG. 4). When referring to the polarization of the regions 13, 14, and 15, the polarizations are compared using the Scalar Projections $S_1$, $S_2$, $S_3$, which are defined as the absolute values of the magnitudes of the polarizations P1, P2, P3 times the cosine of the angle between the direction of the polarizations and the growth direction. In FIG. 4, a positive polarization charge is formed at the interface of the material where $S_2<S_1$ (i.e., AlN/SiC interface), while a negative polarization charge is formed at the interface of the material where $S_2<S_3$ (i.e., AlN/$Al_xGa_{1-x}N$ interface). Note that each of $S_1$, $S_2$ and $S_3$ are negative. The barrier region 14, in an $Al_xGa_{1-x}N$/AlN/SiC photodetector constructed in accordance with the principles of the present invention, enables a solar-blind detector structure that can leverage the low dark current, and high gain of SiC while suppressing its long wavelength response without using an optical filter. In addition, the barrier height presented by region 14 is adjustable by varying the bias voltage, as increasing the reverse bias voltage results in lowering the barrier. The long wavelength photoresponse is suppressed through the formation of an energy barrier that prevents the collection of carriers generated by lower energy photons that are absorbed in the detector. This energy barrier is principally due to the dipole formed across the barrier region that arises from polarization interface charge densities induced by the difference in total polarization between the barrier region and the surrounding regions in the structure; including on one side larger magnitude spontaneous polarization of AlN (barrier region 14) over SiC (absorption-multiplication region 13), and, on the opposite side, over $Al_xGa_{1-x}N$ region 15 in FIGS. 1A and 16 in FIG. 2A. The barrier height increases with barrier region layer 14 thickness in association with the first and second interface charges and can be significantly larger than band offsets. With respect to the embodiment of FIG. 1A, the barrier region 14 blocks collection of holes photogenerated in $Al_xGa_{1-x}N$ contact window region 15. Likewise, with respect to the embodiment of FIG. 2A, the barrier 14 blocks collection of holes generated in $Al_xGa_{1-x}N$ metal contact region 16. As shown in the band diagram of FIG. 4, the barrier permits transport of electrons generated in an upper conduction band valley of SiC (see $E_c(\Gamma)$), but blocks transport from lower valleys (see $E_c(M)$ and $E_c(L)$). Increasing reverse bias reduces the barrier height to permit collection of some electrons generated in lower conduction bands, thereby increasing long wavelength response.

The embodiment of FIG. 1A (incorporating a transparent window 15) is preferred in that, with reference to FIG. 4, the distance over which the potential is dropped within the n-contact region can be modified by adjusting the doping profile within the extended n-contact region (or transparent region 15). In the embodiment of FIG. 1, the doping on the transparent region 15 adjacent to the AlN barrier region 14 has been reduced. Reduction of the doping in the region adjacent to the barrier region 14 is represented by FIG. 4. If the doping was high throughout the n-contact layer, as in the case of FIG. 2A, a much sharper drop in potential would occur in this layer; leading to a larger electric field that may be desirable in some instances.

The preferred embodiments of the present invention shown in FIGS. 1A, 1B, 2A and 2B comprise a heterogeneous n-III-Nitride/i-p-SiC structure operable to extend the deep ultraviolet (DUV) response of SiC below 260 nm, while suppressing the long wavelength response. Since the direct bandgap of aluminum gallium nitride ($Al_xGa_{(1-x)}N$) can be engineered from 3.4 eV to 6.1 eV depending on the AlN to GaN mole fraction, these alloys are employed as UV transparent, n-type contact windows (for example, the transparent windows 15 and 16 in FIG. 1A) to increase the collection of carriers created by absorption of high energy photons in the high electric field depletion region of the nip structure. As described in the following, photo-generated carriers in the $Al_xGa_{(1-x)}N$ windows do not contribute to photoresponse and can therefore be used to adjust the high energy cutoff wavelength of this device.

In order to suppress the long wavelength response of SiC between 260 nm and 380 nm, the preferred embodiments 10 and 20 of FIGS. 1A and 2A, respectively, utilize polarization charge densities induced at the interfaces using a barrier region 14 to create a large barrier to transport and allow only electrons excited by high energy photons to higher energy bands within the SiC region to be collected. Further utilizing a transparent window in the embodiment 10 of FIG. 1A, this transparent window 15 and electron filter (barrier 14) facilitate the fabrication of high responsivity, narrow bandwidth detectors in which the spectral response can be adjusted though the window and barrier properties.

Note that the barrier region 14 functions in a manner different from the interface charge control layer disclosed in U.S. Pat. No. 8,269,223 ('223 Patent). As shown in FIG. 24 of the '223 Patent, an $Al_xGa_{a(1-x)}N$ interface charge control layer (ICCL) 5F operates to improve the transport of holes generated in the GaN:UID layer into the 480 nm SiC:UID layer. Note further that in the '223 Patent, the thickness of interface charge control layer is much thinner than the thickness of barrier region 14 of the embodiments shown in FIGS. 1A and 2A herein. The reduced thickness in the '223 Patent results in conduction and valence band bending associated with the formation of a dipole over a very short distance. As a result, this facilitates the transfer of holes from the GaN absorption region to the SiC multiplication region in the heterogeneous GaN—SiC separate absorption and multiplication (SAM) APD and was called a nitride interface charge control layer (ICCL) (see '223 Patent for details). The coinventors have now theoretically found that this only occurs if the thickness of the AlN region is less than 5 nm; at thicknesses greater than that the barrier created by the dipole will prevent photogenerated holes in the GaN:UID from being collected in the SiC: UID layer. In comparison to U.S. Pat. No. 8,269,223, the thickness of AlN is about one percent of the thickness of the barrier region 14. Thickness reduction results in band bending over a very short distance (~1 nm), that facilitates tunneling of holes from the GaN absorption region to the SiC multiplication region. In the GaN—SiC structure disclosed in the '223 patent, the photoresponse is primarily associated with hole injection to the p-contact layer. In preferred embodiments of FIGS. 1A and 2A, the AlN barrier region 14 is sufficiently thick so that the hole transport from the n-contact layer 16 or transparent $Al_xGa_{1-x}N$ region 15 to the absorption/multiplication region 13 is blocked. However, the barrier in the conduction band allows the transport of high energy photogenerated electrons in the SiC region to cross into the III-Nitride region while simultaneously suppressing the collection of electrons generated by lower energy photons in SiC associated with wavelengths between 260-380 nm.

FIG. 3 illustrates the effect of the barrier region 14 of the preferred embodiments of FIGS. 1A and 2A on the collection of photogenerated electrons in SiC between 260-380 nm. A similar result is expected for a barrier region 14 composed of InAlGaN compositions having greater magnitude total polarization (represented by /P2/ in FIGS. 1B and 2B) than the absorption/multiplication region 13 (represented by /P1/ in FIGS. 1A and 2A) and transparent region 15 (of FIG. 1A) or n-metal contact region 16 of FIG. 2A (represented by /P3/). Specifically, FIG. 3 illustrates the measured DC responsivity of the SiC/AlN/$Al_xGa_{(1-x)}N$ preferred embodiment detector at varying reverse bias (closed figures). For comparison, the DC photoresponse of a homogeneous SiC pin photodiode under unity gain operation is also provided in FIG. 3 (dashed line). At zero bias the DC responsivity is characterized by a single peak around 226 nm with a quantum efficiency (QE) of 20% that is comparable to that of the SiC pin diode. However, the DC response exhibits a strong reverse bias voltage dependence, with peak response increasing and red-shifting with increasing bias. A peak QE of approximately 76% at 242 nm is observed for these devices at 40V that is significantly higher than what is observed for conventional homogeneous SiC pin photodiodes. It is also important to note that the DC response of the SiC/AlN/$Al_xGa_{(1-x)}N$ diodes has a sharp high pass cutoff at approximately 260 nm. The barrier region 14 allows the transport of high energy photogenerated electrons in the SiC region to cross into the III-Nitride region while simultaneously suppressing the collection of electrons generated by lower energy photons in SiC associated with wavelengths between 260-380 nm. The thinnest effective barrier region 14 ranges from approximately 5 nm.

Figure 5:
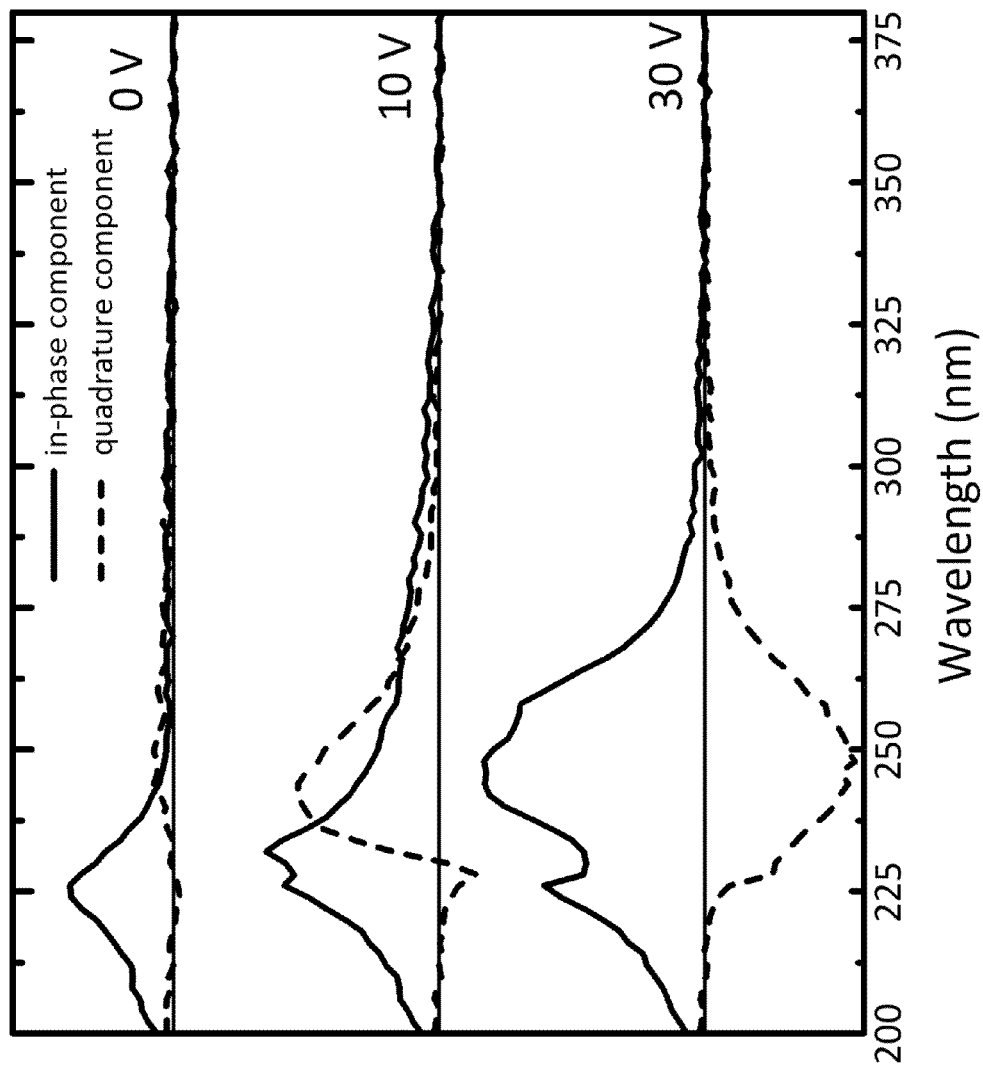
FIG. 5 illustrates the measured modulated photoresponse of a photodetector with varying reverse bias voltage showing an in-phase component and a quadrature component (associated with a time delay).

FIG. 5 shows the measured modulated photoresponse of a typical detector with varying reverse bias voltage. This figure includes the in-phase, or x-component, and the quadrature, or y-component, signals. Consistent with DC measurements, the modulated response also exhibits a single peak at 226 nm at zero bias. The majority of this signal is in the in-phase component with negligible quadrature contribution. Increasing reverse bias voltage results in the increase in the long wavelength contribution; however, unlike the DC measurement, this contribution centered around 242 nm appears distinct from the 226 nm peak. At all reverse bias voltages, the signal below 226 nm has minimal phase delay as indicated by the almost zero quadrature component. The quadrature component appears primarily positive for low bias voltages and turns negative for large bias voltages. It should be noted that in both bias conditions there is a distinct bias dependent, negative quadrature component at 228 nm. Although not as sharp as in the DC measurement, the modulated response also exhibits the long wavelength cutoff at approximately 260 nm.

The origins of the observed spectral response can be understood by considering the influence of the AlN barrier region 14. FIG. 4 shows an illustration of the band alignment between the direct $E_c(\Gamma)$ and indirect ($E_c(L)$, $E_c(M)$) conduction band valleys of 4H-SiC and the direct $\ominus$—valley of the III-Nitride region at zero bias under UV illumination. For the solid lines shown in the central portion of FIG. 4, this illustrates the case where lowest conduction band of SiC is in alignment with AlN. The transition energy between the $\Gamma$-M, $\Gamma$-L and $\Gamma$-$\Gamma$ valleys of SiC was assumed to be 3.25 eV, 4 eV, and 5 eV, respectively, as provided by the Ioffe Physico-Technical Institute. It should be noted there is some uncertainty in these values, especially for the $\Gamma$-$\Gamma$ transition which may lie between 5-6 eV.

At zero bias, there is a large field generated in the AlN region as a result of the positive polarization induced interface charge at the SiC/AlN interface and negative polarization induced interface charge at the AlN/$Al_xGa_{(1-x)}N$ interface. This field, combined with the difference in bandgap, creates a large interface barrier which impedes the injection of holes from $Al_xGa_{(1-x)}N$ to SiC and electrons from SiC to $Al_xGa_{(1-x)}N$, depending upon the energy of the conduction band valley into which the electrons are photoexcited. As shown in FIG. 4, under optical excitation, photogenerated holes in $Al_xGa_{(1-x)}N$ accumulate at the AlN/$Al_xGa_{(1-x)}N$ interface forming a 2 dimensional hole gas (2 DHG) and electrons in the lower, M and L valleys of SiC accumulate at the SiC/AlN interface forming a 2 dimensional electron gas (2 DEG). These accumulated charges partially cancel the polarization charge at each interface and reduce the overall barrier height. Photogenerated holes in the $Al_xGa_{(1-x)}N$ region are still unable to overcome this barrier and therefore no response from $Al_xGa_{(1-x)}N$ is observed, as evidenced by the high energy cutoff in the photoresponse shown in FIGS. 3 and 4 that corresponds to absorption in this layer. Likewise, there is approximately a 2 eV barrier between the M valley of 4H-SiC and AlN which impedes electron injection across the interface leading to a suppressed long wavelength response from SiC. On the other hand, this barrier has a minimal impact on the transport of electrons excited to the $\Gamma$ valley across the interface and therefore these carriers are collected as illustrated by the lightly shaded electrons in FIG. 4. The presence of the 226 nm peak in both the DC and modulated measurements at zero bias is therefore likely due to the direct collection of carriers excited to the $\Gamma$ valley. This conclusion is supported by the lack of phase delay in the modulated photoresponse at wavelengths shorter than 226 nm, which indicates that the signal experiences no time delay associated with the accumulation of carriers at the interface. Due to the large electric field in the SiC region 13, it is expected that the carriers in the $\Gamma$ valley are hot when they reach the barrier and are able to overcome it without difficulty. It is interesting to note that the reported hot electron energy relaxation time in 4H-SiC is about 2.5 psec. Using a saturation velocity of $2 \times 10^7$ cm/sec for electrons in SiC, the calculated average time for an electron to reach the SiC/AlN interface is about 1.7 psec. Considering the strong absorption due to the $\Gamma$-$\Gamma$ transition, most carriers excited at 226 nm are likely generated within $1/\alpha$ cm of the SiC/AlN interface and therefore the average time may be even shorter. However, since the QE measured in this work at 226 nm is only 20%, considerably lower than expected, the hot electron energy relaxation time in the $\Gamma$ valley might be even shorter than 2.5 psec.

As indicated in FIG. 3, increasing the reverse bias voltage increases (decreases) the electric field in the SiC (AlN) region; thus lowering the barrier for carrier injection across the interface. The field is increased in the SiC region and decreased in the AlN region. Although reduced, the barrier continues to impede photo-generated holes in the $Al_xGa_{(1-x)}N$ layer. However, as indicated by the redshift (shifting to a longer wavelength) in the DC photoresponse, hot electrons in lower energy bands of SiC are able to overcome the barrier and be collected. The peak QE of 76% at 40 V is almost double that of typical SiC pin diodes, which exhibit approximately 40% QE at 242 nm under unity gain. This enhanced DUV response is not due to photoconductive gain since the operation of this device relies on the accumulation of both holes and electrons at the interface to lower the barrier. In the modulated measurement at large reverse bias voltages, the long wavelength response experiences a~50 degree phase delay as compared to the 226 nm peak and can be attributed to the charge-accumulation process discussed previously. Considering the spontaneous polarization charge density of $5 \times 10^{-7}$ C/cm$^2$ and the photogenerated current density of $3 \times 10^{-5}$ A/cm$^2$ at optical power of 100 nW and wavelength of 242 nm, the phase delay in these measurements is reasonable. The 226 nm peak exhibits no bias dependence in DC or modulated measurements indicating that this signal is due to the collection of carriers directly from the $\Gamma$ valley and not from carriers that have relaxed from the $\Gamma$ valley to lower energies. Collection of relaxed carriers would likely have a bias dependence based on the lowering of the barrier. The negative quadrature component at 228 nm represents the onset of the interaction with the barrier and is due to hot electrons in the bottom of the $\Gamma$ valley able to tunnel through the barrier. As a result, this signal does experience a phase delay and is bias dependent. This further indicates that the collection of electrons leading to the 242 nm peak are from the lower energy L valley. At low bias voltages, these carriers are impeded by the barrier and therefore their contribution to the photoresponse is suppressed, while at large bias voltages, these carriers are delayed as compared to the 226 nm signal due to interaction with the barrier. Although not shown here, increasing the power of the optical illumination results in a reduced phase lag of the long wavelength signal due to a faster barrier lowering process.

For all bias voltages, the long wavelength (<260 nm) response from the collection of carriers in the M valley is strongly suppressed as shown in the DC photo-response in FIG. 3. This suppression effect is due to the same barrier that creates the bias dependent operation. At large reverse bias voltages investigated in this work, electrons in the M valley of SiC are unable to overcome the barrier at the interface. These carriers instead accumulate at the interface as described previously. The long wavelength filtering effect is slightly less effective in the chopped response due to the time required to accumulate charge at the interface. Under low reverse bias operation, the charge accumulation results in a measureable displacement current indicated by a leading phase, indicated by the positive quadrature component at 10 V. At higher reverse bias voltages (20V-30V), the barrier is lowered and fewer charges are required to form the 2 DEG and 2 DHG. Under these conditions, the photo-current dominates the displacement current resulting in the phase lag of the signal.

The use of $Al_xGa_{(1-x)}N$ alloys as a transparent n-type window increases the collection of electrons created by absorption of high energy photons in the high-field n$^-$-SiC region. Peak QE of 76% at 242 nm has been measured and attributed to the minimization of the effects of surface states and absorption in heavily doped layers currently hindering homogeneous SiC devices. Utilizing the large polarization induced interface charges in these material systems to create a barrier at the interface has been demonstrated to filter the long wavelength response by prohibiting collection of carriers from the M valley of SiC. Adjusting the field in the barrier region through the difference in polarization and thickness adds further control over the long wavelength cutoff and also voltage response.

FIG. 5 shows the measured modulated photoresponse of a photodetector with varying reverse bias voltage. FIG. 5 illustrates the modulated responsivity of SiC/AlN/Al$_x$Ga$_{(1-x)}$N nip photodiode at zero, 10, and 30 volts reverse bias. In-phase component waveforms and quadrature waveforms are illustrated in FIG. 5. Illumination with chopped light was used to facilitate the measurement. The presence of a quadrature waveform component indicates a time delay associated with the measurement. At zero volts, the quadrature component is near zero throughout the wavelength range of 200 to 375 nanometers. At both 10 and 30 volts, the quadrature component is near zero in the 200-220 nm (approximate) range, showing the negligible effects of time delay presumably due to gamma ($E_c(\Gamma)$) valley electrons surmounting the AlN barrier layer, represented by the upper dashed line in FIG. 4. As the wavelength increases, a positive quadrature component indicates the presence of a time delay effect as the quadrature component increases with respect to 10 volts and decreases with respect to 30 volts. FIG. 5 also illustrates that as the reverse bias voltage increases, the AlN barrier decreases in effect, resulting in the wavelength range increasing as shown by the graphs representing the reverse bias voltages of 10 and 30 volts where the long wavelength cut-off in the photoresponse moves to longer wavelength from near 250 nm (in the case of zero volts) to approximately 270-300 nm.

Figure 6:
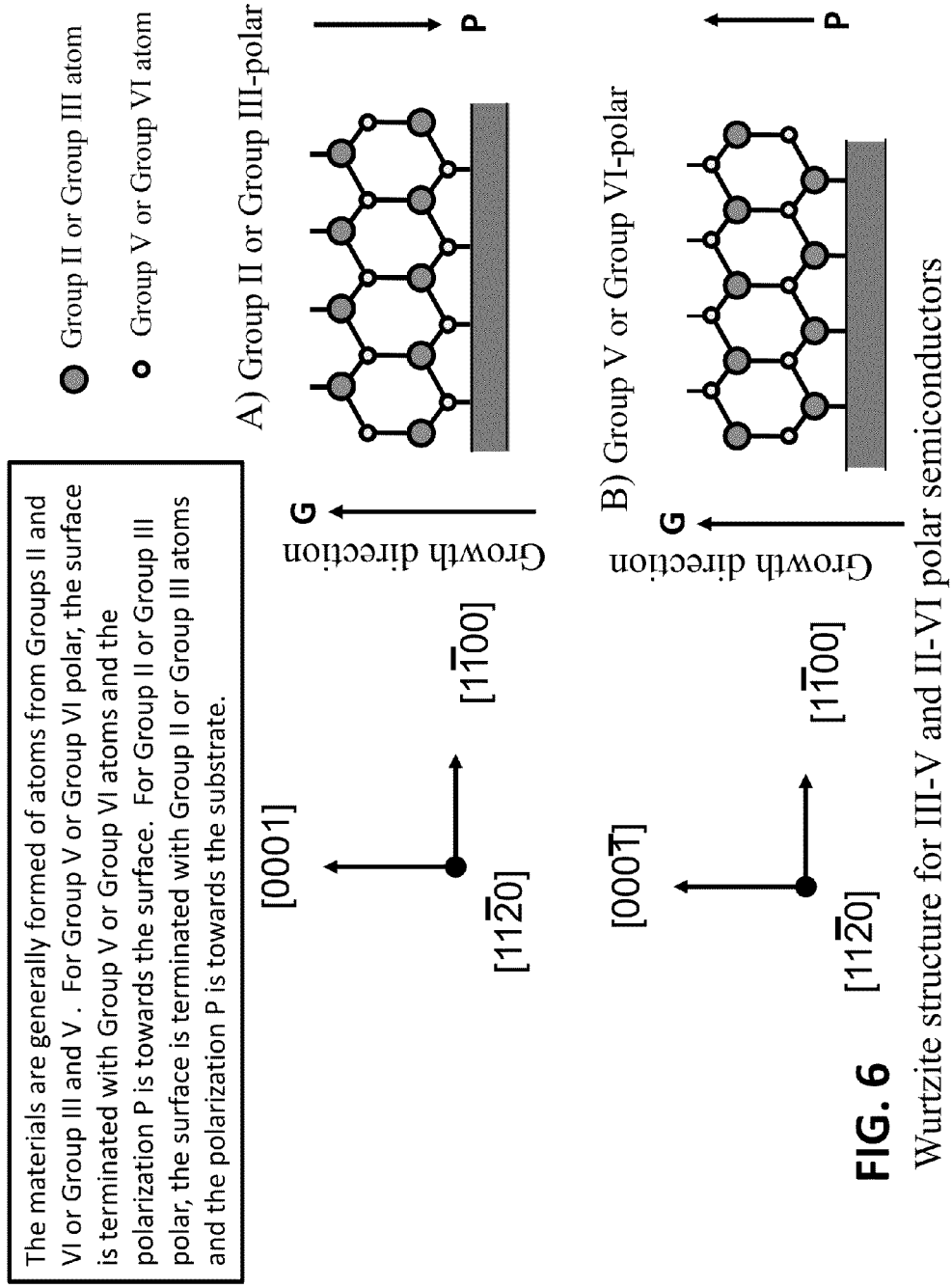
FIG. 6 is a schematic illustration of a crystal structure showing which the growth direction and the polarization vector for Group II and III polar (part (a)) and Group V and VI polar (part (b)).

Referring now to FIG. 6, some of the material layers forming the photodetector are generally formed of atoms from Groups II and VI or Groups III and V. In FIG. 6, the materials are referred to as being Group II or III polar or Group V or VI polar. For Group V or Group VI polar, the surface is terminated with Group V or Group VI atoms and the polarization P is towards the surface. For Group II or Group III polar, the surface is terminated with Group II or Group III atoms and the polarization P is towards the substrate. FIG. 6 part (a) is a schematic illustration of a crystal structure in which the growth direction and the polarization vector are in the opposite direction.

FIG. 6 part (b) is a schematic illustration of a crystal structure in which the growth direction and the polarization vector are in the same direction.

Figure 7:
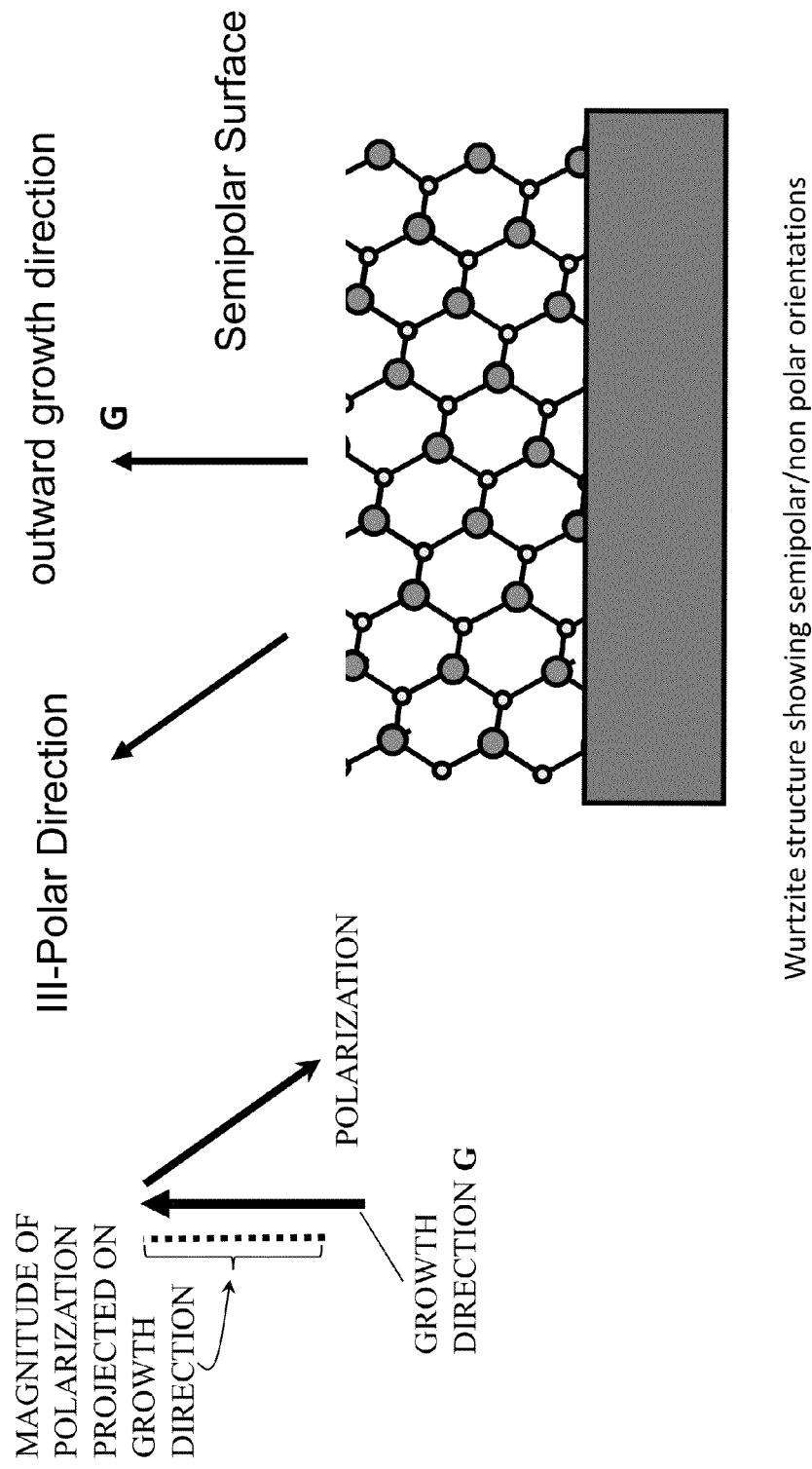
FIG. 7 is a schematic illustration of a crystal structure showing the projection of the magnitude of the polarization vector on the growth direction when the polarization vector and the growth direction are in different directions.

FIG. 7 is a schematic illustration of a crystal structure showing the projection of the magnitude of the polarization vector on the growth direction when the polarization vector and the growth direction are in different directions.

Figure 8A:
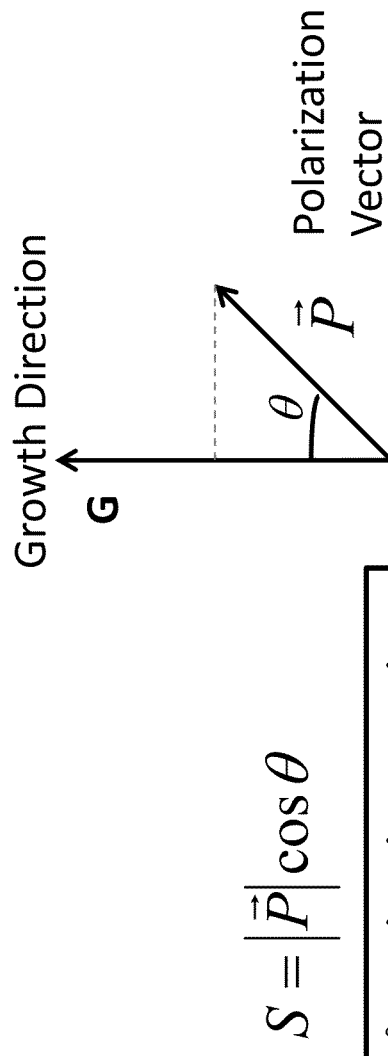
FIG. 8A is a schematic illustration depicting the scalar projection S in relation to the growth direction and Polarization vector P.

FIG. 8A is a depiction of the definition of the scalar projection S as used in the specification and claims. The growth direction refers to the growing of the crystal lattice structure, as illustrated in FIGS. 6 and 7. The polarization vector refers to the total polarization for a particular region (or layer) as referenced above as the absolute value or magnitude of the polarization in FIGS. 1B and 2B. The projection of the polarization vector P on the vector G (designating the growth direction) can also be referred to as the scalar resolute or scalar component of P in the direction of the growth direction G, represented mathematically by:

$$S = |P|\cos\theta = P \cdot \hat{G}$$

where the operator (·) denotes the dot product, $\hat{G}$ is the unit vector in the direction of the Growth Vector G, |P| is the magnitude of the polarization vector P, and θ is the angle between vectors P and G. Note that the scalar projection is equal to the length or magnitude of the projection of P onto G, with a minus sign if the projection has an opposite direction with respect to G. With reference to the right side of the above equation, multiplying the scalar projection of P on G by $\hat{G}$ converts it into the foregoing projection, also referred to as the vector projection of P on G.

The left side of FIG. 8B is a schematic illustration of the portions of the embodiments of FIGS. 1A and 2A which have a determinative polarization component to enable the creation of the electrostatic potential barrier formed of Group III- or Group II-polar materials.

The left side of FIG. 8B is directed preferred embodiments in which the P-type layer is grown closest to the substrate. The right side of FIG. 8B is directed preferred embodiments in which the N-type layer is grown closest to the substrate. Referring to the case of the P-type layer grown closest to the substrate, for Group III- or Group II-polar materials, to enable the creation of the electrostatic potential barrier, the absolute value of the polarization P2, which correlates to the barrier regions 14 in FIGS. 1A, 1B, 2A, and 2B, must be greater than the absolute value of the polarization P1 (which correlates to the absorption/multiplication region 13) and the absolute value of the polarization P3 (which correlates to the region 15 in FIG. 1A and region 16 in FIG. 2A) taken individually. The scalar projection S2 of the region 14 must be less than zero and must be less than the scalar projections S1 (correlating to region 13) and S3 (which correlates to the region 15 in FIG. 1A and region 16 in FIG. 2A), taken individually.

As an example, referring to the preferred embodiment p-SiC/i-SiC/AlN/AlGaN structure of FIG. 1A, |P2|>|P1|,|P3| where P2 is the polarization in AlN barrier region 14, P3 is the polarization in AlGaN transparent window region 15, P1 is the polarization in SiC multiplication/absorption region 13, and theta=180 degrees, which applies to group III polar materials. Hence, the cosine is equal to −1 and this implies that S$_2$=−|P2|, S1=−|P1|, S3=−|P3| and since larger negative numbers are smaller than smaller negative numbers => S2<S1,S3.

With reference to the right side of FIG. 8B, referring to the case of the N-type layer grown closest to the substrate, for Group III- or Group II-polar materials, to enable the creation of the electrostatic potential barrier, the absolute value of the polarization $P_2$, which correlates to the barrier regions 14 in FIG. 9A, must be less than the absolute value of the polarization $P_1$ (which correlates to the absorption/multiplication region 13) and the absolute value of the polarization $P_3$ (which correlates to the region 16 in FIG. 9A) taken individually. The scalar projection $S_2$ of the region 14 must be less than zero and must be greater than the scalar projections $S_1$ (correlating to region 13) and $S_3$ (which correlates to the region 16 in FIG. 9A), taken individually.

With reference to the right side of FIG. 8B, the alternate preferred embodiment 30 of FIG. 9A may be, for example, a III-Nitride/ZnO pin structure grown on bulk ZnO substrate 31 comprising a n-type semiconductor metal contact region or layer 32, which may be, for example, a 2 μm thick n-ZnO layer doped 2×10$^{19}$ cm$^{-3}$, an absorption/multiplication region or layer 33, which may be, for example, a 350 nm thick n$^-$-ZnO layer lightly doped n-type 5×10$^{15}$ cm$^{-3}$, a transparent barrier region or layer 34, which may be, for example, a 120 nm thick Al$_{0.2}$Ga$_{0.8}$N layer 34, and a transparent window region 35 suitable for forming a p-metal contact, which may be, for example, a 50 nm thick p-Al$_{0.40}$Ga$_{0.60}$N layer. The thickness of barrier region or layer 34 may be as thin as 5 nm. The region or layer 35 is predominantly transparent to photons of interest for conversion in that these photons are generally not converted to electrons and holes in region or layer 35. The ZnO epitaxial layers or regions may be grown on n-type Zn— face ZnO substrate 31. The III-polar Al$_x$Ga$_{(1-x)}$N epitaxial layers or regions may be heteroepitaxially grown by plasma assisted molecular beam epitaxy at 780° C. directly upon the ZnO epitaxial layers or regions. Epilayers can be fabricated into, for example, 250 µm diameter, circular mesas with seven degree beveled sidewalls. The p-$Al_xGa_{(1-x)}N$ Ohmic contact 38 comprises of a stack comprising 30 nm Ni/100 nm Au metallization scheme while the n-ZnO Ohmic contact 37 consists of 30 nm Ta/20 nm Au. The selection of metals for the contact layer depend upon metal work-function, adhesion, as well as impurity diffusion considerations. There are a number of Ohmic contacts schemes to p-AlGaN and n-ZnO reported in the literature. The stacks that may be used are commonly employed. The constraint is that the contacts make a low resistance Ohmic contact; in contrast to a Schottky contact.

Referring now to the preferred embodiment n-ZnO/i-ZnO/$Al_xGa_{(1-x)}N$/p-$Al_yGa_{(1-y)}N$, where y>x structure on ZnO substrate 31 of FIG. 9A, |P2|<|P1|,|P3| where P2 is the polarization in $Al_xGa_{(1-x)}N$ barrier region 34, P3 is the polarization in p-$Al_yGa_{(1-y)}N$ transparent window region 35, P1 is the polarization in ZnO multiplication/absorption region 33, and theta=180 degrees, which applies to group III or group II polar materials. Hence, the cosine is equal to −1 and this implies that $S_2$=−|P2|, $S_1$=−|P1|, $S_3$=−|P3| and since larger negative numbers are smaller than smaller negative numbers =>S2>S1,S3. In this case, the preferred embodiment acts as a barrier for hole transport from the lower valleys in the valence band, and therefore as a hole filter rather than an electron filter because it passes higher energy holes or holes in higher energy valleys created by higher energy photons in the multiplication/absorption region 33, thereby operating to define a predetermined wavelength range of the photodetector.

FIG. 8C is a schematic illustration of the portions of the alternative embodiments of FIGS. 9B and 9C which have a determinative polarization component to enable the creation of the electrostatic potential barrier formed of Group V- or Group VI-polar materials. The left side of FIG. 8C is directed preferred embodiments in which the P-type layer is grown closest to the substrate. The right side of FIG. 8C is directed preferred embodiments in which the N-type layer is grown closest to the substrate. Referring to the case of the P-type layer grown closest to the substrate, for Group V- or Group VI-polar materials, to enable the creation of the electrostatic potential barrier, the absolute value of the polarization $P_2$, which correlates to the barrier region 44 in FIG. 9B, must be less than absolute value of the polarization $P_1$ (which correlates to the absorption/multiplication region 43) and the absolute value of the polarization $P_3$ (which correlates to the region 45 in FIG. 9B) taken individually. The scalar projection $S_2$ of the region 44 must be greater than zero and must be less than the scalar projections $S_1$ (correlating to region 43) and $S_3$ (which correlates to the region 45 in FIG. 9B), taken individually.

With reference to the left side of FIG. 8C, the alternate preferred embodiment 40 of FIG. 9B may be, for example, a III-Nitride/ZnO nip structure grown on bulk ZnO substrate 41 comprising a p-type semiconductor metal contact region or layer 42, which may be, for example, a 2 µm thick p-ZnO layer doped $2\times10^{19}$ $cm^{-3}$, an absorption/multiplication region or layer 43, which may be, for example, a 350 nm thick $p^-$-ZnO layer lightly doped p-type $5\times10^{15}$ $cm^{-3}$, a transparent barrier region or layer 44, which may be, for example, a 120 nm thick $Al_{0.2}Ga_{0.8}N$ layer 44, and a transparent window region 45 suitable for forming a n-metal contact, which may be, for example, a 50 nm thick n-$Al_{0.40}Ga_{0.60}N$ layer. The thickness of barrier region or layer 44 may be as thin as 5 nm. The region or layer 45 is predominantly transparent to photons of interest for conversion in that these photons are generally not converted to electrons and holes in region or layer 45. The ZnO epitaxial layers or regions may be grown on n-type O— face ZnO substrate 41. The V-polar $Al_xGa_{(1-x)}N$ epitaxial layers or regions may be heteroepitaxially grown by plasma assisted molecular beam epitaxy at 780° C. directly upon the ZnO epitaxial layers or regions. Epilayers can be fabricated into, for example, 250 µm diameter, circular mesas with seven degree beveled sidewalls. The n-$Al_xGa_{(1-x)}N$ Ohmic contact 47 comprises of a stack comprising Ti 10 nm/Al 100 nm/Ni 30 nm/Au 50 nm metallization scheme while the p-ZnO Ohmic contact 48 consists of 30 nm Ni/100 nm Au. The selection of metals for the contact layer depend upon metal work-function, adhesion, as well as impurity diffusion considerations. There are a number of Ohmic contacts schemes to n-AlGaN and p-ZnO reported in the literature. The stacks that may be used are commonly employed. The constraint is that the contacts make a low resistance Ohmic contact; in contrast to a Schottky contact.

Referring now to the FIG. 9B example, additional preferred embodiment p-ZnO/i-ZnO/$Al_xGa_{(1-x)}N$/n-$Al_yGa_{(1-y)}N$, where y>x structure on ZnO substrate 41, the polarization relationship is |P2|<|P1|,|P3| where P2 is the polarization in $Al_xGa_{(1-x)}N$ barrier region 44, P3 is the polarization in n-$Al_yGa_{(1-y)}N$ transparent window region 45, P1 is the polarization in ZnO multiplication/absorption region 43, and theta=0 degrees, which applies to group V or group VI polar materials. Hence, the cosine is equal to 1 and this implies that $S_2$=|P2|, $S_1$=|P1|, $S_3$=|P3| with S2<S1,S3. In this case, the preferred embodiment acts as a barrier for electron transport from the lower valleys in the conduction band of the multiplication/absorption region 43, and therefore as an electron filter because it passes higher energy electrons or electrons in higher energy valleys created by higher energy photons, thereby operating to define a predetermined wavelength range of the photodetector.

With reference to the right side of FIG. 8C, referring to the case of the N-type layer grown closest to the substrate, for Group V- or Group VI-polar materials, to enable the creation of the electrostatic potential barrier, the absolute value of the polarization $P_2$, which correlates to the barrier region 54 in FIG. 9C, must be greater than the polarization $P_1$ (which correlates to the absorption/multiplication region 53) and the polarization $P_3$ (which correlates to the region 55 in FIG. 9C) taken individually. The scalar projection $S_2$ of the region 54 must be greater than zero and must be greater than the scalar projections $S_1$ (correlating to region 53) and $S_3$ (which correlates to the region 55 in FIG. 9C), taken individually.

FIG. 9C is an illustration of an alternate preferred embodiment 50, a Group V or Group VI-polar, n-down photodetector. Alternative preferred embodiment 50 comprises a substrate 51 formed of, for example, silicon carbide. An n-metal contact region 52 may be formed of 2000 nm n-SiC. An absorption/multiplication region 53 may be, for example, formed of 350 nm v-SiC. Barrier region 54 is formed on the absorption/multiplication region 53. A p-metal contact region or layer 55 has terminals 58 positioned thereon. The n-SiC Ohmic contact 57 consists of Ni 35 nm/Ti 50 nm/Al 200 nm/Au 100 nm. while the p-$Al_xGa_{(1-x)}N$ Ohmic contact 58 comprises of a stack comprising 30 nm Ni/100 nm Au metallization scheme. The contacts 57 and 58 are similar to element number 7 in the U.S. Pat. No. 8,269,223, FIG. 23, herein incorporated by reference. Referring now to the FIG. 9C additional preferred embodiment n-SiC/i-SiC/AlN/p-AlGaN structure has a polarization ratio of |P2|>|P1|,|P3| where P2 is the polarization in AlN barrier region 54, P3 is the polarization in AlGaN transparent p-contact layer 55, P1 is the polarization in SiC multiplication/absorption region 53, and theta=0 degrees, which applies to group V or group VI polar materials. Hence, the cosine is equal to 1 and this implies that $S_2=|P2|$, $S1=|P1|$, $S3=|P3|$ with $S2>S1,S3$. In this case, the preferred embodiment acts as a barrier for hole transport from the lower valleys in the valence band, and therefore as a hole filter rather than an electron filter because it passes higher energy holes or holes in higher energy valleys created by higher energy photons in the multiplication/absorption region 53, thereby operating to define a predetermined wavelength range of the photodetector.

Although only one mesa is illustrated in FIGS. 1A and 2A, a group of mesas that form an array could be interconnected and used together. Using the teaching shown in conjunction with FIGS. 1A and 2A, one of ordinary skill in the art could create an array of mesas, in which case each mesa could produce a single pixel in an image array.

Optionally, the entire assembly (with the exception of the metal contact areas) is covered with a layer of $SiO_2$, deposited by plasma-enhanced chemical vapor deposition (PECVD).

It is important to note that the suppression observed in the response between 260-380 nm is associated with the energy band structure associated with the M- and L-valleys of SiC. The preferred embodiments of FIGS. 1A and 2A can be used to detect light in the solar blind region that is normally considered to be less than 280 nm at low elevations. Using different materials as an absorption/multiplication region will allow the fabrication of detectors that are sensitive with different bandwidths associated with suppression of the collection of photogenerated carriers that is related to their particular band structure. For example, detectors may be fabricated using an absorption\multiplication region 13 comprised of Zinc Oxide or Magnesium Zinc Oxide by employing a barrier layer 14 of suitable total polarization (see FIGS. 9A and 9B).

It is important to note that the absorption/multiplication regions or layers 13, 33, 43, and 53 may be composed of a single layer or a number of layers that may spatially separate absorption and multiplication or modify electric field distribution within the region.

Potential usages of the preferred embodiments of the present invention include replacing the photomultiplier tube (PMT) within compact biological agent identification systems based on fluorescence free Raman spectroscopy, employing these detectors within water monitoring systems, replacing UV enhanced Si avalanche photodiodes within sniper fire weaponry detections systems; replacing PMTs and UV enhanced Si avalanche photodiodes in UV communications systems. Solar-blind ultraviolet detectors are useful for bioagent detection-identification systems for hospitals, and commercial HVAC systems as well as compact water quality monitoring systems for disaster relief workers and outdoor enthusiasts.

Currently system designers requiring high sensitivity and low noise UV detectors for spectroscopy and single photon counting have the option of employing PMTs or UV enhanced Si APDs. Generally speaking PMTs have significant shortcomings including high cost, bulky packaging, requiring high voltage for operation (>1000 V) and cooling for high sensitivity. UV enhanced Si APDs can provide high gain, but can have high dark current and significant long wavelength response that can make them suboptimal for certain applications. SiC APDs are still in the developmental stage but they can have high gain and very low dark current. However, these devices exhibit low quantum efficiencies at long wavelength approaching the band gap (~380 nm) because of poor absorption due to the indirect band gap of SiC. Most of these detectors are inherently broad band thus expensive optical filtering is often required to narrow the spectral response to a desired band such a solar-blind or visible-blind. Operation in the solar blind region is useful for imaging/detecting human-generated phenomena against a solar background. These devices are critical for developing systems for sniper fire detection, UV communications, biological-chemical agent identification and detection, and water quality monitoring.

In contrast, the preferred embodiments of the present invention utilize a novel approach to provide a long wavelength cut-off to the photoresponse of a photodetector that leverages the polarization interface charge that occurs at the heterointerfaces between materials with different polarity. By inserting an appropriate barrier layer within the photodetector design, the long wavelength response can be significantly suppressed. One embodiment of particular military and commercial interest is the development of solar-blind or visible-blind detectors with no, or greatly reduced, optical filter requirements. A solar-blind $Al_xGa_{1-x}N/AlN/SiC$ Electron Filter Photodetector (EFP) (illustrated schematically in FIG. 1A) has been demonstrated that has significant cut-off of long wavelength response at 260 nm. These devices are attractive as a replacement for PMTs and UV enhanced Si APDs for system designers because of (1) lower cost—an $Al_xGa_{1-x}N/AlN/SiC$ EFP can be produced at significantly lower cost than PMTs; (2) room temperature operation—An $Al_xGa_{1-x}N/AlN/SiC$ EFP can be operated at room temperature, while PMTs often require thermoelectric cooling depending upon the sensitivity required, and (3) Fragility—PMTs require the cathode detection material and dynode gain medium to be encased within a vacuum sealed tube. This packaging is inherently more fragile than that employed for semiconductor based detectors; (4) Solar/Visible blind detection—An $Al_xGa_{1-x}N/AlN/SiC$ EFP can be made inherently visible/solar blind by tuning the relative AlN, InN and GaN compositions of the III-Nitride barrier and contact layers. In contrast, UV-enhanced Si APDs require external filters that can be costly depending upon the level of rejection required. $Al_xGa_{1-x}N/AlN/SiC$ EFPs (shown schematically in FIG. 1) exhibit peak unity gain quantum efficiency (QE) of ~76% at 242 nm that is significantly higher than what is observed for conventional homogeneous SiC pin photodiodes and a long wavelength cut-off at 260 nm.

As used herein (in the drawings, specification, abstract and claims), the term "light" means electromagnetic radiation, unless specifically noted to the contrary. In the drawings, the symbol λ means electromagnetic radiation. Within the light spectrum, the solar blind region refers to the region of the light spectrum wherein, due to absorption of sunlight by the atmosphere, the potential interfering effect of sunlight does not occur; i.e., normally considered to be less than 280 nm at low elevations.

As used herein, the terminology "layer" includes "region" and is not limited to a single thickness of a material covering or overlying another part or layer, but encompasses a region having a variety of configurations and/or thicknesses.

As used herein, the terminology "multiplication layer" or "multiplication region" means a layer or layers or region in which the carriers predominantly multiply. The carriers may be either holes and/or electrons.

As used herein, the terminology "absorption layer", "absorption region", "absorber", "absorber region" means a layer or layers or region in which photons are predominantly absorbed and photogenerated carriers created. Absorption and multiplication may occur in the same layers (or regions).

As used herein, the terminology (In)GaN refers to the binary compound GaN or a ternary compound of InGaN having arbitrary mole fraction of InN.

As used herein, the terminology (Al)GaN or $(Al_x)Ga_{(1-x)}N$ refers to the binary compound GaN (when x=0) or a ternary compound of AlGaN having arbitrary mole fraction of AlN.

As used herein, the scalar projection of the polarization vector P on the vector G (designating the growth direction), which can also be referred to as the scalar resolute or scalar component of P in the direction of the growth direction G, is given by:

$$S=|P|\cos\theta=P\cdot\hat{G}$$

where the operator (·) denotes the dot product, $\hat{G}$ is the unit vector in the direction of the Growth Vector G, |P| is the magnitude of the polarization vector P, and θ is the angle between vectors P and G. Note that the scalar projection is equal to the length or magnitude of the projection of P onto G, with a minus sign if the projection has an opposite direction with respect to G. With reference to the right side of the above equation, multiplying the scalar projection of P on G by $\hat{G}$ converts it into the foregoing projection, also referred to as the vector projection of P on G.

As used herein, the terminology (Al)(In)GaN or (In)(Al)GaN refers to the binary compound GaN or ternary or quaternary III-Nitride semiconductor compound having arbitrary mole fractions of InN and/or AlN.

As used herein, the terminology (In)AlN refers to the binary compound AlN or ternary compound having arbitrary mole fractions of InN.

As used herein the term P in bold face represents the magnitude of the polarization vector.

As used herein, the terminology "potential" with respect to "electrostatic potential" refers to voltage potential.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the claims.

The invention claimed is:

1. A photodetector for detecting photons in a predetermined wavelength range comprising:
   a substrate;
   a p-type layer located above the substrate suitable for forming a p-metal contact thereon;
   a first region in which absorption and multiplication of carriers occurs, the first region having a crystalline structure having a growth direction and a first total polarization having a magnitude and direction;
   a second region adjacent to the first region having a second total polarization, the second region comprising a crystalline structure having a growth direction and the second total polarization having a magnitude and direction, the first and second regions forming a first interface therebetween, the magnitudes and directions of the first and second total polarizations being such that a scalar projection of the second total polarization on the growth direction is less than a scalar projection of the first total polarization projected onto the growth direction thereby creating a positive first interface charge; and
   a third region suitable for forming an n-metal contact thereon, the third region having a growth direction and a third total polarization with a magnitude and direction, the second and third regions forming a second interface therebetween, the third total polarization having a scalar projection on the growth direction that is greater than the scalar projection of the second polarization onto the growth direction, creating a negative second interface charge;
   the positive first and negative second interface charges separated by a thickness of the second region creating an electrostatic potential barrier to carriers of differing energy levels; the electrostatic potential barrier defining the predetermined wavelength range of the photodetector.

2. The photodetector of claim 1 wherein the electrostatic potential barrier defining the predetermined wavelength range may be changed by changing the thickness of the second region in association with the positive first and negative second interface charges.

3. The photodetector of claim 1 wherein the second region has a sufficient thickness that precludes tunneling of carriers from the third region to the first region.

4. The photodetector of claim 1 wherein the third region has an n-metal contact associated therewith, the p-layer has the p-metal contact associated therewith, and further comprising a first terminal associated with the p-metal contact and a second terminal being associated with the n-metal contact, the first and second terminals adapted to be connected to a voltage source, and wherein the electrostatic potential barrier may be adjusted by adjusting a voltage level of the voltage source.

5. The photodetector of claim 1 wherein the electrostatic potential barrier can be raised by adding donors near the first interface which are ionized to increase a net positive charge near the first interface or adding acceptors near the second interface which are ionized to increase a net negative charge near the second interface.

6. The photodetector of claim 1 wherein the electrostatic potential barrier can be lowered by adding acceptors near the first interface which are ionized to decrease a net positive charge near the first interface or adding donors near the second interface which are ionized to decrease a net negative charge near the second interface.

7. The photodetector of claim 1 wherein the electrostatic potential barrier may be adjusted by varying a material composition of the first, second and third regions, wherein the first region contains a substantially undoped or lightly doped region adjacent to the first interface, comprised of a material having a band gap small enough so as to enable a generation of carriers by photon absorption, and wherein the second and third regions are comprised of materials having a bandgap large enough to be transparent to the photons generating carriers in the first region, and wherein the third region is conducting such that the substantially undoped or lightly doped region of the first region adjacent to the first interface is substantially depleted so as to enable enhanced collection of photogenerated carriers near the first interface.

8. The photodetector of claim 1 wherein the third region comprises a region suitable for forming an n-metal contact thereon and an undoped region that is transparent to the photons.

9. The photodetector of claim 1 wherein the predetermined wavelength range is less than 260 nanometers due to suppression of the collection of photogenerated electrons between 260-380 nm, and wherein the first region comprises silicon carbide, the second region comprises one of aluminum nitride and aluminum gallium nitride and the third region comprises aluminum gallium nitride of higher gallium content than the second region.

10. The photodetector of claim 1 wherein materials forming the first, second and third regions are selected from the group consisting of gallium nitride, indium gallium nitride, aluminum gallium nitride, indium aluminum gallium nitride, indium aluminum nitride, boron aluminum nitride, boron aluminum gallium nitride, aluminum nitride, boron nitride, and indium nitride, silicon carbide, silicon, zinc oxide, magnesium oxide, magnesium zinc oxide, zinc sulfide, cadmium sulfide, cadmium zinc sulfide, magnesium zinc sulfide, cadmium telluride, cadmium zinc telluride, and other Group III-V and Group II-VI polar materials.

11. A photodetector for detecting photons in a predetermined wavelength range comprising:
  a substrate;
  a n-type layer located above the substrate suitable for forming a n-metal contact thereon;
  a first region in which absorption and multiplication of carriers occurs, the first region having a crystalline structure having a growth direction and a first total polarization having a magnitude and direction;
  a second region adjacent to the first region, the second region having a crystalline structure having a growth direction and a second total polarization having a magnitude and direction, the first and second regions forming a first interface therebetween, the magnitudes and directions of the first and second total polarizations being such that a scalar projection of the second total polarization on the growth direction is greater than a scalar projection of the first total polarization projected onto the growth direction thereby creating a negative first interface charge; and
  a third region suitable for forming a p-metal contact thereon, the third region having a crystalline structure having a growth direction and a third total polarization having a magnitude and direction, the second and third regions forming a second interface therebetween, the third total polarization having a scalar projection on the growth direction that is less than the scalar projection of the second total polarization onto the growth direction, creating a positive second interface charge;
  the positive first and negative second interface charges separated by a thickness of the second region creating an electrostatic potential barrier to carriers of differing energy levels; the electrostatic potential barrier defining a predetermined wavelength range of the photodetector.

12. The photodetector of claim 11 wherein the electrostatic potential barrier defining the predetermined wavelength range may be changed by changing the thickness of the second region in association with the positive first and negative second interface charges.

13. The photodetector of claim 11 wherein the second region has a sufficient thickness that precludes tunneling of carriers from the third region to the first region.

14. The photodetector of claim 11 wherein the third region has the p-metal contact associated therewith, the n-layer has the n-metal contact associated therewith, and further comprising a first terminal associated with the n-metal contact and a second terminal being associated with the p-metal contact, the first and second terminals adapted to be connected to a voltage source, and wherein the electrostatic potential barrier may be adjusted by adjusting a voltage level of the voltage source.

15. The photodetector of claim 11 wherein the electrostatic potential barrier can be raised by adding donors near the second interface which are ionized to increase a net positive charge near the second interface or adding acceptors near the first interface which are ionized to increase a net negative charge near the first interface.

16. The photodetector of claim 11 wherein the electrostatic potential barrier can be lowered by adding acceptors near the second interface which are ionized to decrease a net positive charge near the second interface or adding donors near the first interface which are ionized to decrease a net negative charge near the first interface.

17. The photodetector of claim 11 wherein the electrostatic potential barrier may be adjusted by varying a material composition of the first, second and third regions, wherein the first region contains a substantially undoped or lightly doped region adjacent to the first interface, comprised of a material having a band gap small enough so as to enable a generation of carriers by photon absorption, and wherein the second and third regions are comprised of materials having a bandgap large enough to be transparent to the photons generating carriers in the first region, and wherein the third region is conducting such that the substantially undoped or lightly doped region of the first region adjacent to the first interface is substantially depleted so as to enable enhanced collection of photogenerated carriers near the first interface.

18. The photodetector of claim 11 wherein the predetermined wavelength range is less than 260 nanometers due to suppression of the collection of photogenerated electrons between 260-380 nm, and wherein the first region comprises silicon carbide, the second region comprises one of aluminum nitride and aluminum gallium nitride and the third region comprises aluminum gallium nitride of higher gallium content than the second region.

19. The photodetector of claim 11 wherein the first, second and third regions are formed of materials selected from the group of Group III-V polar materials or Group II-VI polar materials or silicon carbide or silicon.

* * * * *